United States Patent
Kanegae et al.

(10) Patent No.: US 7,663,191 B2
(45) Date of Patent: Feb. 16, 2010

(54) SEMICONDUCTOR DEVICE AND MANUFACTURING METHOD THEREOF WITH ROUNDED GATE INCLUDING A SILICIDE ON THE TOP AND AT THE CORNERS

(75) Inventors: Kenshi Kanegae, Osaka (JP); Akihiko Tsuzumitani, Kyoto (JP); Atsushi Ikeda, Shiga (JP)

(73) Assignee: Panasonic Corporation, Osaka (JP)

( * ) Notice: Subject to any disclaimer, the term of this patent is extended or adjusted under 35 U.S.C. 154(b) by 313 days.

(21) Appl. No.: 11/178,612

(22) Filed: Jul. 12, 2005

(65) Prior Publication Data
US 2006/0006478 A1    Jan. 12, 2006

(30) Foreign Application Priority Data
Jul. 12, 2004    (JP) .............................. 2004-204727

(51) Int. Cl.
*H01L 27/092* (2006.01)
*H01L 27/095* (2006.01)

(52) U.S. Cl. ........................ 257/368; 257/383; 257/384; 257/388; 257/E29.156; 257/E29.161

(58) Field of Classification Search ................. 257/383, 257/384, 388, E29.156, E29.161
See application file for complete search history.

(56) References Cited

U.S. PATENT DOCUMENTS

| 4,477,310 | A | * | 10/1984 | Park et al. .................... 438/301 |
| 5,739,573 | A | * | 4/1998 | Kawaguchi .................. 257/384 |
| 5,851,890 | A | * | 12/1998 | Tsai et al. ..................... 438/303 |
| 6,096,609 | A | * | 8/2000 | Kim et al. ..................... 438/281 |
| 2007/0218606 | A1 | * | 9/2007 | Ozawa et al. ................ 438/165 |

FOREIGN PATENT DOCUMENTS

| JP | 07-066421 | 3/1995 |
| JP | 09-074199 | 3/1997 |
| JP | 2003-224265 A | 8/2003 |

* cited by examiner

*Primary Examiner*—Walter L Lindsay, Jr.
*Assistant Examiner*—Ron Pompey
(74) *Attorney, Agent, or Firm*—McDermott Will & Emery LLP

(57) ABSTRACT

In order that a top surface of a gate electrode does not have sharp portions, ends of the top surface of the gate electrode are rounded before refractory metal is deposited for silicidation. This reduces intensive application of film stresses which are generated in heat treatment, enabling formation of a silicide layer with a uniform, sufficient thickness.

18 Claims, 8 Drawing Sheets

US 7,663,191 B2

SEMICONDUCTOR DEVICE AND MANUFACTURING METHOD THEREOF WITH ROUNDED GATE INCLUDING A SILICIDE ON THE TOP AND AT THE CORNERS

CROSS REFERENCE TO RELATED APPLICATIONS

This application claims priority under 35 U.S.C. §119 on Patent Application No. 2004-204727 filed in Japan on Jul. 12, 2004, the entire contents of which are hereby incorporated by reference.

BACKGROUND OF THE INVENTION

1. Technical Field

The present invention generally relates to a semiconductor device and a manufacturing method thereof. More particularly, the present invention relates to a semiconductor device having a silicide layer on a gate electrode and a manufacturing method thereof.

2. Background Art

For improved miniaturization, density, and speed of semiconductor elements such as MOS (Metal Oxide Semiconductor) transistors and for reduced power consumption thereof, it is important to reduce resistances of polysilicon gate electrodes, polysilicon wirings, and source/drain diffusion layers of MOS transistors. A silicide process which uses silicide, a compound of silicon and metal, is known as a technology for reducing these resistances.

When a silicide process is used to form MOS transistors, a silicide layer is formed in the surface portion of polysilicon gate electrodes and the surface portion of source/drain regions. Since the silicide layer has a lower resistance than that of polysilicon, resistances of the gate electrodes and the source/drain regions are reduced by the silicide process. A salicide process, a method for siliciding a gate electrode and source/drain regions simultaneously in a self-aligned manner, is also known in the art.

FIG. 11 is a cross-sectional view of a MOS transistor formed by a conventional salicide process (for example, Japanese Laid-Open Patent Publication No. 2003-224265). As shown in FIG. 11, the conventional semiconductor device has a gate electrode 231, a sidewall 210, and source/drain regions 237. The gate electrode 231 has a rectangular cross section and is formed on a substrate 201 with a gate insulating film 202 interposed therebetween. The sidewall 210 is formed on the substrate 201 and covers the whole side surface of the gate electrode 231. The source/drain regions 237 are formed in the surface portion of the substrate 201 on both sides of the gate electrode 231. The gate electrode 231 is formed from polysilicon or the like. A silicide layer 214 of a refractory metal is formed in the surface portion of the gate electrode 231 and the respective surface portions of the source/drain regions 237.

Since the sidewall 210 is formed on the side surface of the gate electrode 231, such a semiconductor device can be produced by a salicide process. In the salicide process, a refractory metal film (not shown) is formed on the substrate 201 so as to cover the gate electrode 231 and the sidewall 210 formed on the side surface of the gate electrode 231. The surface portion of the gate electrode 231 and the respective surface portions of the source/drain regions 237 are then silicided in a self-aligned manner by heat treatment. Note that a cap film which serves as an anti-oxidation film is also formed on the refractory metal film.

In such a semiconductor device, the gate electrode 231 has a rectangular cross section, and the sidewall 210 covers the whole side surface of the gate electrode 231. Therefore, film stresses are generated in the boundary between the surface of the gate electrode 231 and the sidewall 210 when the refractory metal and silicon are caused to react by heat treatment in the silicidation process. Such film stresses are applied intensively to the corners of the top surface of the gate electrode 231. As a result, silicide is likely to gather in the middle of the surface portion of the gate electrode 231, and both ends of the gate electrode 231 are less likely to be silicided. As shown in FIG. 11, the silicide layer 214 formed in the surface portion of the gate electrode 231 is therefore likely to be shallow at the ends and deep in the middle when viewed in cross section. The reason why the silicide layer 214 has such an uneven thickness is as follows: refractory metal expands to a large degree by heat treatment, whereas silicon does not expand very much. Moreover, the sidewall 210 which is formed from a silicon oxide film, a silicon nitride film, a lamination thereof, or the like is less likely to expand by heat treatment as compared to silicon. Therefore, high film stresses are generated especially near the boundary between silicon and the sidewall and the refractory metal in the upper portion of the gate electrode 231.

Forming a silicide layer 214 having a large cross-sectional area in the gate electrode 231 can reduce the resistance of the gate electrode 231. In the above semiconductor device, however, both ends of the gate electrode 231 are less likely to be silicided, and therefore, it is difficult to form a silicide layer 214 having a uniform thickness and a large cross-sectional area in the gate electrode 231. Accordingly, the gate electrode 231 has an increased, unstable resistance, causing delay of electric signals of the gate electrode 231 and unstable operation of the semiconductor device. Especially, as the gate width of the gate electrode 231 is reduced, the influence of the corners (ends) of the top surface of the gate electrode 231 is increased, whereby the rate of increase in resistance of the gate electrode 231 and the incidence of delay of electric signals are increased. As a result, operation of the semiconductor device becomes more unstable. Such a problem occurs when the width of the gate electrode is 150 nm or less, and becomes significant when the width of the gate electrode is 100 nm or less.

Japanese Laid-Open Patent Publication No. 9-74199 proposes a method for increasing the cross-sectional area of a silicide layer. As shown in FIG. 12, in this method, the height of sidewalls 7a, 7b is reduced so that each silicide layer 9a, 9b includes a part of a side surface of a corresponding gate electrode 4a, 4b. In this structure, however, a substrate 1 which forms source/drain regions 9c may be damaged in the step of forming the sidewalls 7a, 7b, whereby a junction leakage current may be increased. Moreover, control of the sidewall width may become difficult due to the reduced height of the sidewalls 7a, 7b.

Japanese Laid-Open Patent Publication No. 7-66421 proposes another method for increasing the cross-sectional area of a silicide layer. As shown in FIG. 13, in this method, the corners (ends) of the top surface of a gate electrode 21 are removed so that a silicide layer 31 has a mountain shape. In this method, however, the top surface of the gate electrode 21 has sharp portions (corners), and film stresses which are generated between the top surface of the gate electrode 21 and a refractory metal layer are applied intensively to these sharp portions. As a result, in heat treatment, a cap film and the refractory metal film may crack and thermal diffusion of the refractory metal into silicon may be prevented. The resultant silicide layer therefore may not have a sufficient thickness.

SUMMARY OF THE INVENTION

The present invention is made in view of the above problems, and it is an object of the present invention to provide a semiconductor device having a uniform thickness, low resistance silicide layer in a gate electrode and a manufacturing method thereof.

According to a first aspect of the invention, a semiconductor device includes a substrate, and a gate electrode formed on the substrate and extending in a prescribed direction. The gate electrode has a silicide layer at its top surface. In a cross section perpendicular to the prescribed direction, a bottom surface of the silicide layer has an upward-convex, approximately circular arc shape and a top surface of the silicide layer has an upward-convex, approximately circular arc shape. A bottom surface of the silicide layer has an approximately circular arc shape downward from a side end of the silicide layer toward the center direction and a top surface of the silicide layer has an approximately circular arc shape upward from a side end of the silicide layer toward the center direction.

The "upward-convex, approximately circular arc shape" as used herein need not necessarily be an exact circular arc, and includes an upward-convex curve which is a part of an ellipse, and the like. The cross-sectional shape of the bottom surface and the cross-sectional shape of the top surface are preferably similar to each other.

Preferably, in the cross section perpendicular to the prescribed direction, the top surface of the gate electrode has a rounded end, and the rounded end of the top surface of the gate electrode has a radius of curvature of 20 nm to 50 nm.

Preferably, a sidewall is formed on a side surface of the gate electrode, and a distance between the top surface of the gate electrode and a top end of the sidewall is 0 nm to 50 nm.

Preferably, the gate electrode includes a first gate electrode having an electrode width of less than 150 nm and a second gate electrode having an electrode width of more than 500 nm. In a silicide layer of the first gate electrode which is present in a boundary region with the sidewall, a thickness of the silicide layer located below the top end of the sidewall is 40% or more of a thickness of a silicide layer in a middle of the second gate electrode in a width direction.

In a preferred embodiment, the silicide layer is formed from two layers.

According to a second aspect of the invention, a semiconductor device includes a substrate, and a gate electrode formed on the substrate and extending in a prescribed direction. A silicide layer is formed at a top surface of the gate electrode after an end of the top surface of the gate electrode is rounded in a cross section perpendicular to the prescribe direction.

According to a third aspect of the invention, a method for manufacturing a semiconductor device including a substrate and a gate electrode formed on the substrate and extending in a prescribed direction, the gate electrode having a silicide layer at its top surface, includes the steps of: (A) forming the gate electrode on the substrate by etching; (B) after the gate electrode is formed, rounding an end of the top surface of the gate electrode in a cross section perpendicular to the prescribed direction; (X) forming a sidewall on a side surface of the gate electrode so that a top end of the sidewall is located lower than or at a same height as that of a bottom of the rounded end of the top surface of the gate electrode; and forming a silicide layer in a portion of the gate electrode which is exposed from the sidewall.

In a preferred embodiment, the step (B) is a step of terminating the step (A) when a mask formed on the gate electrode in the step (A) becomes a triangular or trapezoidal shape in the cross section perpendicular to the prescribed direction, and rounding the end of the top surface of the gate electrode by conducting etching under different conditions from those of the step (A). The mask as used herein refers to an etching mask.

In a preferred embodiment, the step (B) includes the steps of (C) forming an insulating film on the top surface of the gate electrode with high density plasma so that the insulating film has a triangular or trapezoidal shape in the cross section perpendicular to the prescribed direction, and (D) etching back the insulating film and the gate electrode. The etchback process refers to a process of etching the whole surface without forming an etching mask.

In a preferred embodiment, in the step (D), etching conditions are changed during the etchback process so that a ratio of an etching rate of the insulating film to an etching rate of the gate electrode is increased.

Preferably, in the step (C), an insulating film is formed also on the substrate with the high density plasma.

In a preferred embodiment, in the step (C), the insulating film on the gate electrode is thinner than the insulating film on the substrate.

In a preferred embodiment, the step (B) includes the steps of (C) forming an insulating film on the top surface of the gate electrode with high density plasma so that the insulating film has a triangular or trapezoidal shape in the cross section perpendicular to the prescribed direction, and conducting chemical mechanical polishing to the insulating film and the gate electrode.

Preferably, in the step (C), an insulating film having a thickness of at least a half of a height of the gate electrode is formed on the substrate with the high density plasma.

In a preferred embodiment, the step (B) includes the steps of forming a boron phosphorus silicate glass film on the substrate and the gate electrode, causing the boron phosphorus silicate glass film to flow by heat treatment, and etching back the boron phosphorus silicate glass film and the gate electrode.

Preferably, the boron phosphorus silicate glass film is removed with vapor phase hydrofluoric acid after the step (B).

According to a fourth aspect of the invention, a method for manufacturing a semiconductor device including a substrate and a gate electrode formed on the substrate and extending in a prescribed direction, the gate electrode having a silicide layer at its top surface, includes the steps of: forming on a first silicon layer deposited on the substrate a mask for forming the gate electrode; forming the gate electrode by etching the first silicon layer so that a part of the first silicon layer remains on the substrate other than a region where the gate electrode is to be formed; removing the mask; forming a second silicon layer on the gate electrode and on the first silicon layer remaining on the substrate; rounding an end of the top surface of the gate electrode in a cross section perpendicular to the prescribed direction by etching back the second silicon layer and the first silicon layer remaining on the substrate; (X) forming a sidewall on a side surface of the gate electrode so that a top end of the sidewall is located lower than or at a same height as that of a bottom of the rounded end of the top surface of the gate electrode; and forming a silicide layer in a portion of the gate electrode which is exposed from the sidewall.

The first silicon layer and the second silicon layer can be selected as appropriate from polysilicon, amorphous silicon, and doped silicon. Preferably, the first silicon layer is formed from polysilicon and the second silicon layer is formed from polysilicon. When amorphous silicon is selected, an oxide film having a larger thickness can be obtained by a later oxidizing process such as ashing. When amorphous silicon is selected, silicon layers having a larger grain size can be obtained due to crystallization of the silicon layers by a later heat-treatment process. Silicon layers may be selected according to such characteristics.

Preferably, in the step (X), a difference between a radius of curvature of the rounded end of the top surface of the gate electrode and a distance between the top surface of the gate electrode and the top end of the sidewall is 0 nm to 30 nm.

According to a fifth aspect of the invention, a method for manufacturing a semiconductor device including a substrate and a gate electrode formed on the substrate and extending in a prescribed direction, the gate electrode having a silicide layer at it top surface, includes the steps of: forming the gate electrode on the substrate by etching; forming a sidewall on a side surface of the gate electrode so that a top end of the sidewall is located lower than the top surface of the gate electrode; (E) rounding an end of the top surface of the gate electrode in a cross section perpendicular to the prescribed direction after the sidewall is formed; and forming a silicide layer in a portion of the gate electrode which is exposed from the sidewall.

In a preferred embodiment, the step (E) is a step of rounding the end of the top surface of the gate electrode by deforming the top surface of the gate electrode by conducting ion implantation to the top surface of the gate electrode.

In a preferred embodiment, the step (E) is a step of rounding the end of the top surface of the gate electrode by deforming the top surface of the gate electrode by conducting sputtering to the top surface of the gate electrode.

Preferably, an ion species of the ion implantation is one selected from the group consisting of phosphorus (P), arsenic (As), gallium (Ga), indium (In), antimony (Sb), bismuth (Bi), and thallium (Tl).

In a preferred embodiment, a sputtering material of the sputtering is one selected from the group consisting of silicon (Si), germanium (Ge), tin (Sn), and lead (Pb).

In a preferred embodiment, a sputtering material of the sputtering is one selected from the group consisting of argon (Ar), xenon (Xe), krypton (Kr), and radon (Rn).

In a preferred embodiment, the step (E) includes the steps of forming an oxide film at the top surface of the gate electrode by conducting heat treatment in an oxygen atmosphere or a water vapor atmosphere, and removing the oxide film.

Preferably, in the step (E), a difference between a radius of curvature of the rounded end of the top surface of the gate electrode and a distance between the top surface of the gate electrode and the top end of the sidewall is 0 nm to 30 nm.

In a preferred embodiment, the step (E) is a step of rounding the end of the top surface of the gate electrode by deforming the top surface of the gate electrode by siliciding the top surface of the gate electrode.

According to a sixth aspect of the invention, a method for manufacturing a semiconductor device including a substrate and a gate electrode formed on the substrate and extending in a prescribed direction, the gate electrode having a silicide layer at its top surface, includes the steps of: forming the gate electrode on the substrate by etching; forming a sidewall on a side surface of the gate electrode so that a top end of the sidewall is located lower than or at a same height as that of the top surface of the gate electrode; after the sidewall is formed, forming a silicide layer in a portion of the gate electrode which is exposed from the sidewall; and conducting silicidation again by forming a metal layer having a melting point of at least 1,400° C. on the silicide layer and conducting heat treatment.

DETAILED DESCRIPTION OF THE INVENTION

Hereinafter, embodiments of the present invention will be described in detail with reference to the accompanying drawings.

First Embodiment

A first embodiment will be described with reference to the drawings.

FIGS. 1A to 1G' illustrate a method for manufacturing a semiconductor device of the present invention. FIGS. 1A to 1G are cross-sectional views of a portion near a gate electrode 131 in a manufacturing process flow of siliciding a gate electrode 131 after rounding the ends of the top surface of the gate electrode 131. The gate electrode 131 extends in a prescribed direction on a substrate 101. FIGS. 1A to 1G are cross-sectional views along the direction which is perpendicular to the prescribed direction, perpendicular to the substrate, and parallel to the width direction of the gate electrode 131. For convenience, hatching which represents cross section is omitted throughout the figures of the embodiments shown below.

Hereinafter, a manufacturing process of a gate electrode 131 will be described.

Figure 1A:
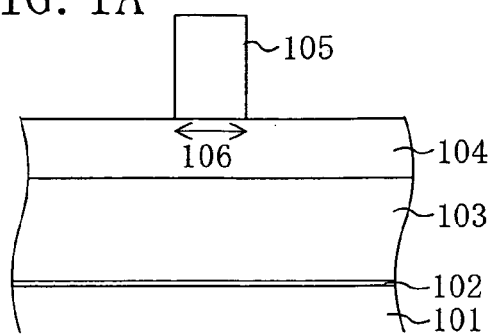
FIGS. 1A, 1B, 1C, 1D, 1E, 1F, 1G, and 1G' are cross-sectional views illustrating a manufacturing process flow of forming a silicided gate electrode according to a first embodiment of the present invention.

As shown in FIG. 1A, a thin thermal oxide film having a thickness of about 1 nm to about 10 nm is formed on the semiconductor substrate 101. A polysilicon film 103 having a thickness of about 150 nm to about 200 nm is then deposited on the thermal oxide film. The thin thermal oxide film will serve as a gate insulating film 102 and the polysilicon film 103 will become a gate electrode 131. A TEOS (Tetra-Ethoxy-Silane) film 104, a hard mask, is then deposited on the polysilicon film 103 by a CVD (Chemical Vapor Deposition) method. The deposition thickness of the TEOS film 104 is determined so that the TEOS film 104 remains with a thickness of about 10 nm to about 40 nm after the step of etching the polysilicon film 103 into a gate electrode shape. A resist 105 for forming a gate electrode is formed on the TEOS film 104 by a lithography process. The resist 105 has a width 106 of about 60 nm to about 150 nm. This resist width 106 is the gate width of the gate electrode.

Figure 1E:
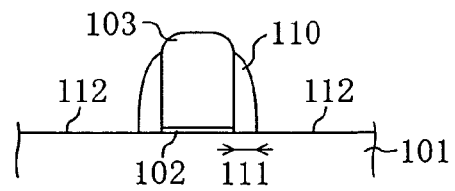
Figure 1B:
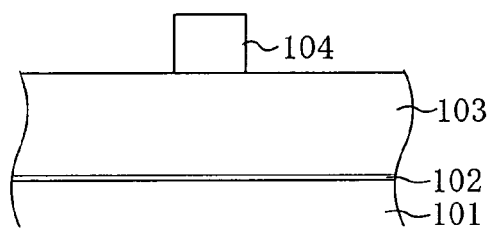

As shown in FIG. 1B, the films shown in FIG. 1A are anisotropically etched by a dry etching process using plasma. A mask pattern of the TEOS film 104 thus formed has a shape corresponding to the shape of the resist film 105. The resist 105 is then removed by an ashing process using oxygen plasma.

Figure 1F:
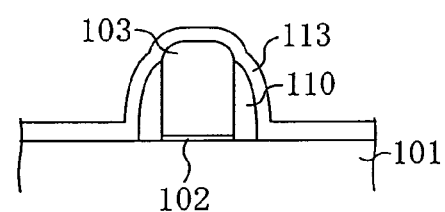
Figure 1C:
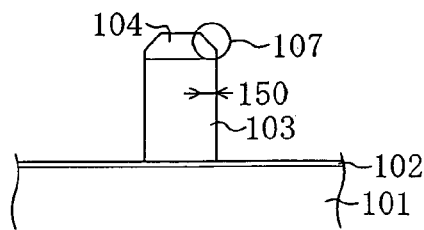

As shown in FIG. 1C, by using the TEOS film 104 of FIG. 1B as a mask, the polysilicon film 103 is anisotropically etched by a dry etching process using plasma. This etching forms the shape of the gate electrode 131. During this etching process, the TEOS film 104 is gradually etched, and the ends of a top surface of the TEOS film 104 are chamfered by collision with etching species. In other words, the corners of the TEOS film 104 are etched more than the remaining portion of the TEOS film 104, and therefore, are tapered at a prescribed taper angle. When the etching process of the polysilicon film 103 is completed, the TEOS film 104 on the polysilicon film 103 has a thickness of about 10 nm to about 40 nm and has a taper 107 at both ends of its top surface with a taper angle of about 45 degrees. Each of the tapered portions of the TEOS film 104 (i.e., each of the portions having the taper 107) has a width 150 of about 10 nm to about 30 nm.

The above etching process of the polysilicon film 103 is conducted under the following conditions:

1. Initial oxide-film etching step
2. Main etching step
   pressure: 2 mTorr to 10 mTorr;
   source power: 300 W to 450 W, bias power: 20 W to 150 W; and
   gas flow ratio: $Cl_2$:HBr:$CF_4$:$O_2$=0.8 to 1.2:0.8 to 1.2:0.8 to 1.2:0.05 to 0.15
3. Over-etching step
   pressure: 10 mTorr to 100 mTorr;
   source power: 150 W to 350 W, bias power: 50 W to 150 W;
   gas flow ratio: HBr:He:$O_2$=0.8 to 1.2:0 to 1.0:0.01 to 0.10; and
   substrate temperature: 50° C. to 100° C.

The above initial oxide-film etching step is a step of etching a natural oxide film formed at the surface of the polysilicon film 103 and an oxide layer formed by the ashing process which is conducted prior to the etching process. The main etching step is a step of etching the polysilicon film 103 so that the underlying gate insulating film 102 is hardly exposed. The over-etching step is a step of etching the polysilicon film 103 so that the underlying gate insulating film 102 is completely exposed. Etching is completely stopped at the gate insulating film 102.

Figure 1G:
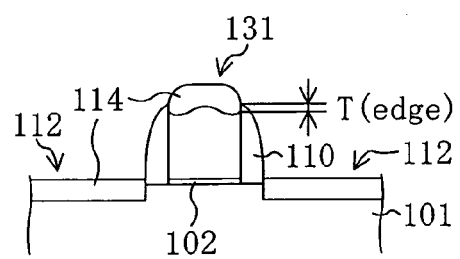
Figure 1D:
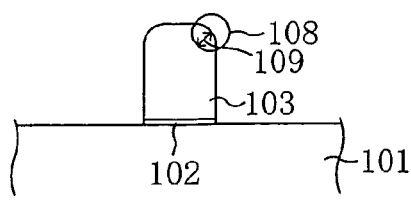
Figure 1G:
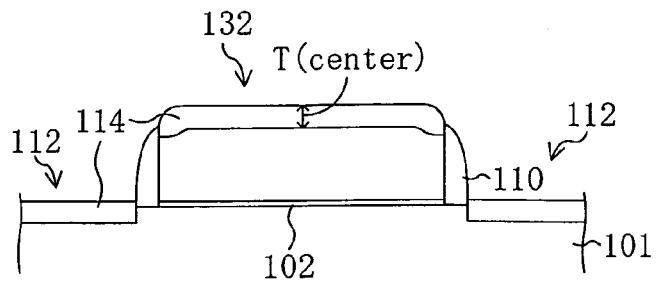

As shown in FIG. 1D, the polysilicon film 103 and the TEOS film 104 remaining thereon as shown in FIG. 1C are etched back by an anisotropic etching process. This etchback process is conducted under such conditions that the polysilicon film 103 is relatively likely to be etched. The conditions are as follows:

pressure: 5 Pa to 20 Pa;
power: 100 W to 200 W; and
gas flow ratio: $CHF_3$:$O_2$=1:0.01 to 0.05.

Figure 9A:
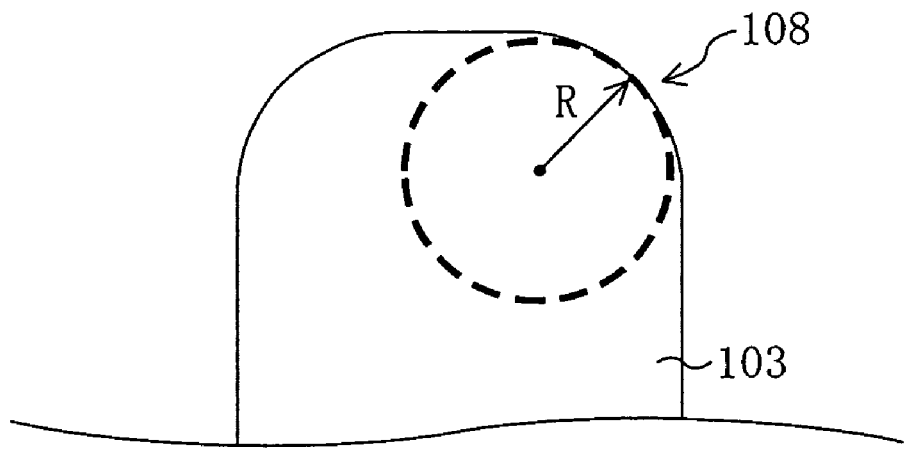
FIGS. 9A and 9B are enlarged cross-sectional views of a top surface portion of a gate electrode prior to silicidation according to the present invention.

In this etchback process, the ends of the top surface of the polysilicon film 103 are rounded (rounded ends 108). The reason why the rounded ends 108 are formed is as follows: the corners of the ends of the top surface of the polysilicon film 103 are etched faster than a flat portion of the top surface of the polysilicon film 103. Moreover, the polysilicon film 103 is etched according to the shape of the tapers 107 of the TEOS film 104. As a result, the ends of the top surface of the polysilicon film 103 have a gently rounded shape. A round radius (radius of curvature) 109 of the rounded ends 108 is about 15 nm to about 40 nm. As shown in FIG. 9A, this radius of curvature is a radius R of an inscribed circle of the rounded end 108.

The substrate 101 is etched somewhat in this etchback process. However, the degree to which the substrate 101 is etched is very small because the etching conditions of the etchback process are determined so that the corners of the ends of the top surface of the polysilicon film 103 are etched faster than the remaining portion of the polysilicon film 103. Accordingly, this etchback process hardly degrades transistor capabilities. The TEOS film 104 need not necessarily be removed completely by this etchback process.

Figure 9B:
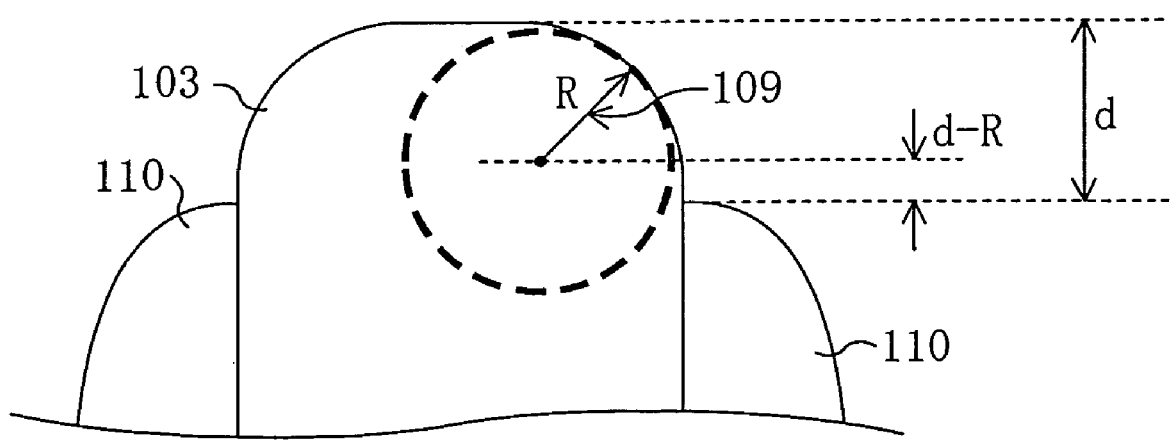

As shown in FIG. 1E, a sidewall 110 is formed after extension implantation or the like. The sidewall 110 is formed by depositing a sidewall film on the substrate 101 and etching back the sidewall film by anisotropic etching. The sidewall film is formed from an insulating material such as an oxide film or a nitride film, or a lamination of such insulating materials. As shown in FIG. 9B, the sidewall film is preferably etched back by such an amount that the top end of the sidewall 110 is located slightly lower than or at the same height as that of the bottom (lower end) of the rounded end 108 of the polysilicon film 103 having a gate electrode shape. In other words, the value (d–R) is preferably in the rage of about 0 nm to about 30 nm, where d is the distance between the top end of the polysilicon film 103 and the top end of the sidewall 110 and R is a round radius 109 of the rounded ends 108. Even when (d–R) is not in the above range, the top surface of the polysilicon film 103 can be silicided in a later silicidation process, but a cap layer may crack. Moreover, when the etchback amount is increased, a sidewall width 111 may be varied and the substrate 101 may be etched and damaged, whereby transistor characteristics may be varied. Therefore, the above etchback amount is preferable. In the etchback process, the corners of the ends of the top surface of the polysilicon film 103 are etched faster than the flat portion of the top surface of the polysilicon film 103. Therefore, the round radius 109 of the rounded ends 108 is slightly increased to about 20 nm to about 50 nm in this etchback process.

Ions are then implanted into the surface of the substrate 101 and the implanted species is activated by heat treatment to form source/drain regions 112.

As shown in FIG. 1F, a refractory metal 113 such as cobalt is deposited on the whole surface of the substrate 101 for silicidation.

As shown in FIG. 1G, heat treatment is conducted in an inert gas atmosphere by a salicide process in order to form a silicide layer 114 at the top surface of the gate electrode 131. The silicide layer 114 is formed in a portion of the polysilicon layer 103 which is exposed from the sidewall 110. The silicide layer 114 is formed at the top surface of the gate electrode 131 and at the surface of the source/drain regions 112. In the heat treatment, film stresses are generated due to the difference in coefficient of thermal expansion between the refractory metal 113 and the polysilicon film 103 and the sidewall 110. However, since the polysilicon film 103 has the rounded ends 108 at its top surface, the film stresses are less likely to be intensively applied to a specific portion. Moreover, since the gate surface profile including the polysilicon film 103 and the sidewall 110 is not so angular, the film stresses are less likely to be intensively applied to a specific portion. Accordingly, problems which are caused by intensive application of film stresses can be prevented. In other words, cracking of the refractory metal 113 including a cap film, and insufficient diffusion of the refractory metal 113 into the polysilicon film 103 and insufficient diffusion of the polysilicon film 103 into the refractory metal 113 (insufficient silicidation) can be prevented. Note that the cap film is present on the surface of the refractory metal 113, but is shown to be included in the refractory metal 113 in FIG. 1F. Therefore, the cap film is not shown in FIG. 1F.

As shown in FIG. 1G, in the gate electrode 131 having the silicide layer 114 thus formed, the bottom surface of the silicide layer 114 has an upward-convex circular arc shape. The top surface of the silicide layer 114 also has an upward-convex circular arc shape. A bottom surface of the silicide layer 114 has an approximately circular arc shape downward from a side end of the silicide layer 114 toward the center direction and a top surface of the silicide layer 114 has an approximately circular arc shape upward from a side end of the silicide layer 114 toward the center direction. Since both top and bottom surfaces of the silicide layer 114 have an upward-convex circular arc shape, the silicide layer 114 has an approximately uniform thickness in the cross section of FIG. 1G and the ratio of the maximum thickness to the minimum thickness of the silicide layer 114 is 1.43 or less. Moreover, the gate electrode 131 having the silicide layer 114 has rounded ends at its top surface, and the shape of the rounded ends corresponds to the shape of the rounded ends 108 of the polysilicon film 103. Therefore, the rounded ends of the top surface of the gate electrode 131 have a radius of curvature (round radius) of 20 nm to 50 nm. The distance between the top end of the sidewall 110 and the top surface of the gate electrode 131 is 50 nm or less.

As described above, the silicidation reaction can be made to proceed sufficiently in the present embodiment. Therefore, the silicide layer 114 has a sufficient thickness even at the ends of the gate electrode 131 (i.e., even at the boundary with the sidewall 110) regardless of the gate width. It is assumed that a gate electrode (first gate electrode) 131 having a width of less than 150 nm as shown in FIG. 1G and a gate electrode (second gate electrode) 132 having a width of more than 500 nm as shown in FIG. 1G' are formed on a single substrate 101. In this case, of the thickness T(edge) of the silicide layer 114 of the first gate electrode 131 which is located in the boundary region with the sidewall 110, the thickness of the silicide layer 114 located below the top end of the sidewall 110 is 40% or more of the thickness T(center) of the silicide layer 114 in the middle of the second gate electrode 132 in the width direction. Since the silicide layer 114 has a sufficient thickness even at the ends of the gate electrode 131 (i.e., even at the boundary region with the sidewall 110) regardless of the gate width, variation in resistance within an individual gate electrode 131 and variation in resistance between a plurality of gate electrodes 131 are reduced.

Thereafter, the unreacted refractory metal 113 is removed so that only the silicide layer 114 is left.

By the above semiconductor manufacturing process, a low-resistance, stable gate electrode 131 having a silicide layer 114 of a uniform thickness and having less variation in resistance can be obtained.

Figure 10:
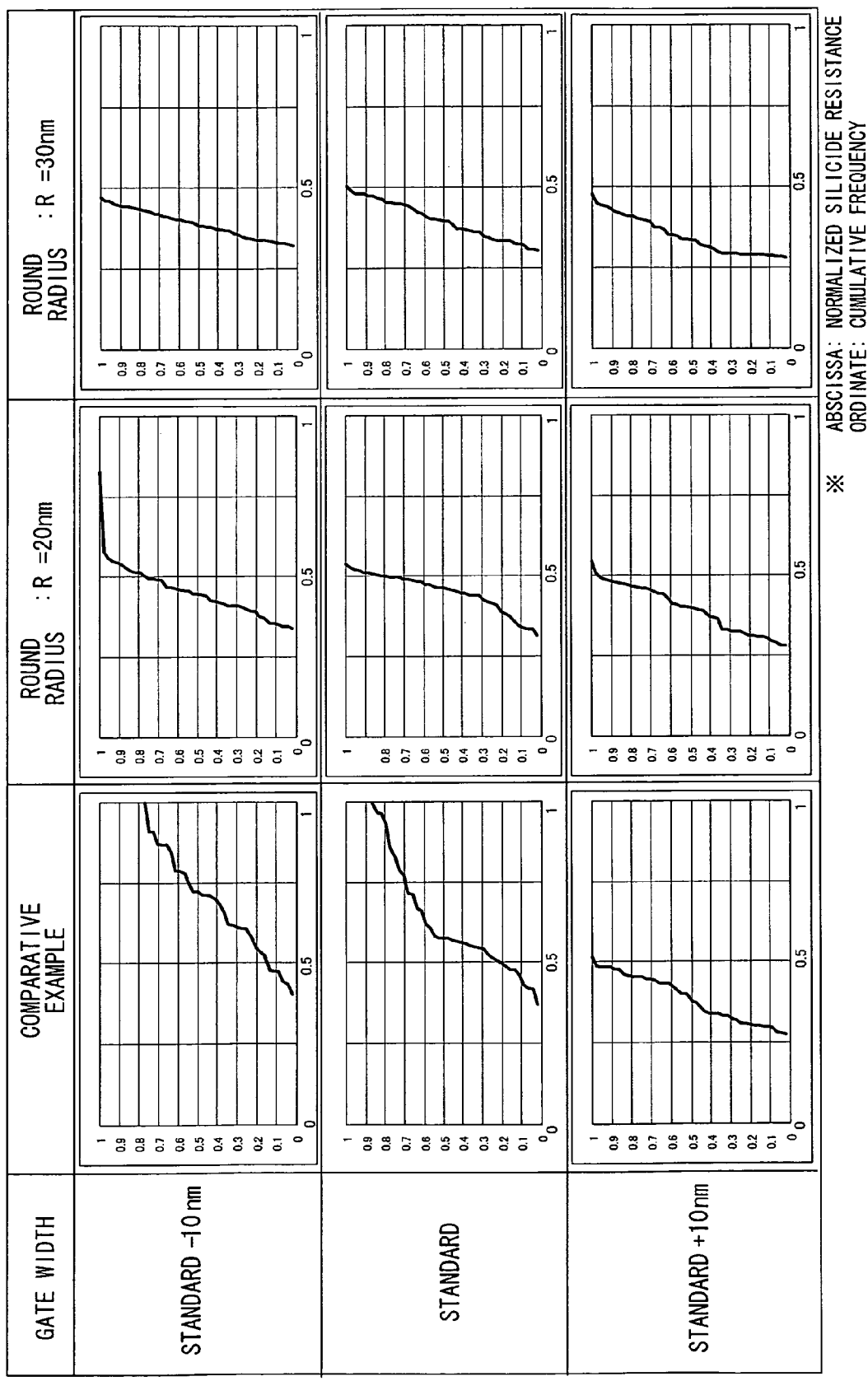
FIG. 10 shows cumulative frequency distributions of the silicide resistance of a silicided gate electrode of the present invention and a conventional example.
Figure 11:
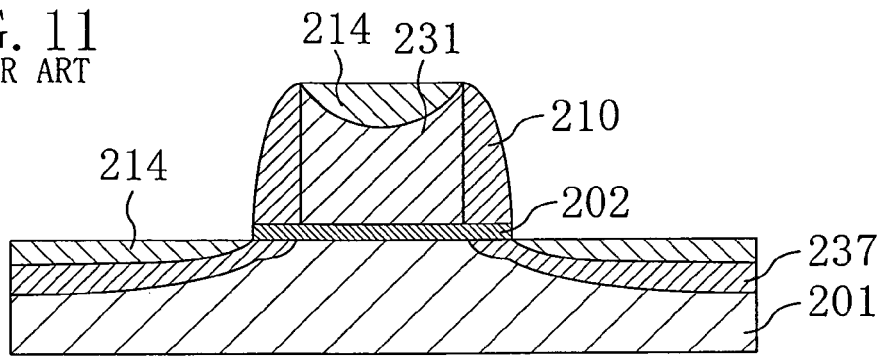
FIG. 11 is a cross-sectional view of a silicided gate electrode of a conventional example.
Figure 12:
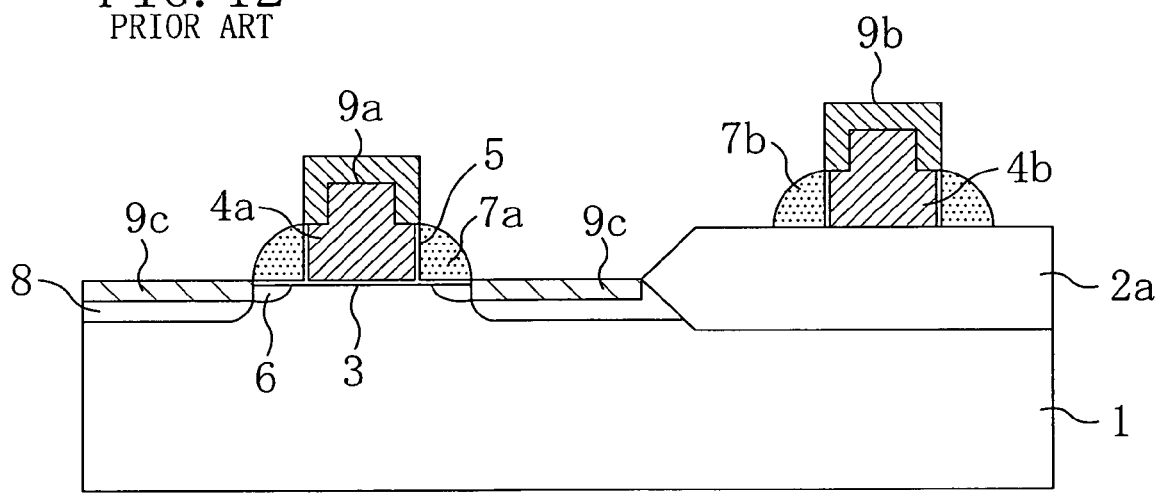
FIG. 12 is a cross-sectional view of a silicided gate electrode in another conventional example.
Figure 13:
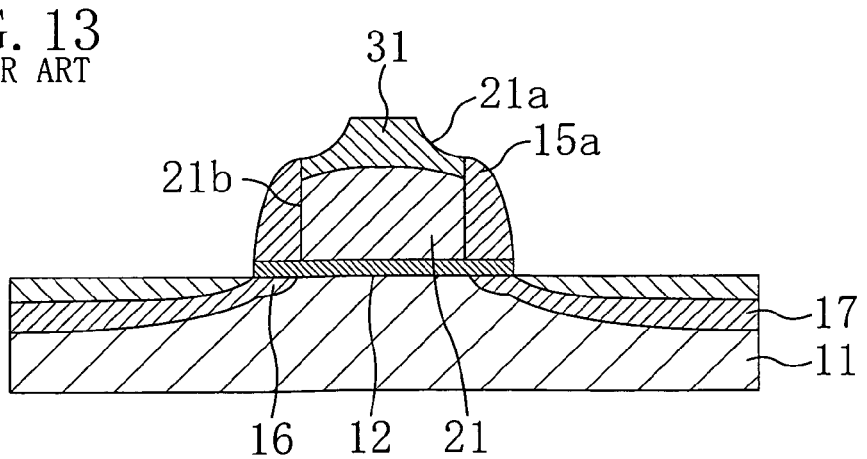
FIG. 13 is a cross-sectional view of a silicided gate electrode in still another conventional example.

FIG. 10 shows cumulative frequency distributions of the silicide resistance of the gate electrode 131 of the present embodiment and the silicide resistance of a gate electrode of a comparative example. The gate electrode of the comparative example is a gate electrode in which the bottom surface of the silicide layer does not have an upward-convex circular arc shape. The gate electrode of the comparative example was obtained by conducting a silicidation process without rounding the ends of the top surface of the polysilicon film. In the comparative example, the ends of the top surface of the silicide layer have a radius of curvature of 10 nm or less in a cross section perpendicular to the extending direction of the gate electrode. The normalized silicide resistance of the abscissa is a silicide resistance converted to a sheet resistance based on the gate electrode length and the gate electrode width. In this chart, the upper specification limit of the sheet resistance of the device specifications is shown as 1.

In FIG. 10, the round radii (radii of curvature) R of 20 nm and 30 nm show the results of the present embodiment. In both the comparative example and the present embodiment, silicide resistance distributions were obtained for the gate electrode 131 having a standard gate width and for the gate electrode 131 having a standard gate width ±10 nm.

As can be seen from FIG. 10, in the comparative example, resistance increase is remarkable for the standard gate width or less, and the normalized resistance is 1 or more at about 20% of all the measuring points for the standard gate width or less. On the other hand, in the present embodiment (the gate electrodes having a round radius R of 20 nm and 30 nm), resistance increase is suppressed even for the standard gate width or less, and the normalized resistance does not reach 1 or more at any measuring point.

Accordingly, by employing a round radius of 20 nm or more as in the present embodiment, a low-resistance, stable gate electrode 131 having less variation in resistance can be obtained.

In the present embodiment, the gate electrode 131 is formed simply from a polysilicon film. However, the gate electrode 131 may be formed from a doped polysilicon film having phosphorus (P) or boron (B) doped therein during formation of the polysilicon film, or a polysilicon film having ions of phosphorus (P), boron (B), arsenic (As), indium (In), antimony (Sb), bismuth (Bi), thallium (Tl), or the like implanted therein after formation of the polysilicon film. Alternatively, the gate electrode 131 may be formed from an amorphous silicon film, a lamination of a polysilicon film and an amorphous silicon film, a doped polysilicon film having its doping species concentration varied during formation of the polysilicon film.

In the present embodiment, cobalt is used as the refractory metal 113. However, the present invention is not limited to this. The refractory metal 113 may be any metal having a melting point of 1,400° C. or higher such as titanium, nickel, tungsten, molybdenum, tantalum, chromium, palladium, platinum, and the like.

The cap film is preferably titanium nitride (TiN), titanium (Ti), or a lamination of TiN and Ti.

In the present embodiment, the TEOS film 104 is used as a hard mask. However, a SiON film, an ARL (Anti-Reflection-Layer), can be preferably used as a hard mask in order to increase dimension accuracy of the gate electrode 131. Alternatively, a CVD (Chemical Vapor Deposition) film such as ozone NSG (Nondoped-Silicate-Glass), HDP (High-Density-Plasma) NSG, and a silicon nitride film may be used as a hard mask.

In the present embodiment, in order to form the rounded ends 108 at the top surface of the polysilicon layer 103 as shown in FIG. 1D, the deposition thickness of the TEOS film 104 as a hard mask is determined so that the TEOS film 104 remains with a thickness of about 10 nm to about 40 nm in FIG. 1C. However, in the case where the process requires a thick remaining TEOS film 104, the thickness of the remaining TEOS film 104 can be adjusted by anisotropic dry etching, isotropic etching, or the like after the polysilicon film 103 is etched in FIG. 1C. The TEOS film 104 having the tapers 107 for forming the rounded ends 108 of FIG. 1D can be formed by this adjustment. The TEOS film 104 is an oxide film. Therefore, by selecting an appropriate etching species, the thickness of the remaining TEOS film 104 can be easily adjusted while hardly etching silicon such as the substrate 101, the polysilicon film 103, and the like. Even when a silicon nitride film or a silicon oxynitride (SiON) film is used as a hard mask instead of the TEOS film 104, damages to the substrate 101 and the polysilicon film 103 can be avoided by selecting an appropriate etching species.

In the present embodiment, a hard mask (TEOS film 104) is used to form the polysilicon film 103 into a gate electrode shape. However, the same effects as those described above can be obtained even when the polysilicon film 103 is formed into a gate electrode shape by forming the resist 105 directly on the polysilicon film 103 and using the resist 105 as a resist mask for forming a gate pattern.

Second Embodiment

Hereinafter, a second embodiment of the present invention will be described with reference to the drawings. Note that description of the same steps, the same structure, and the same effects as those of the first embodiment will be omitted.

Figure 2A:
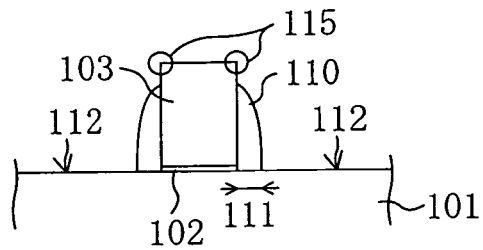
FIGS. 2A and 2B are cross-sectional views illustrating a manufacturing process flow of forming a silicided gate electrode according to a second embodiment of the present invention.
Figure 2B:
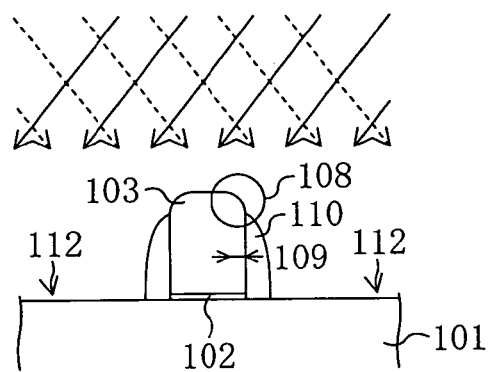

FIGS. 2A and 2B show a part of a method for manufacturing a semiconductor device of the second embodiment. FIGS. 2A and 2B are cross-sectional views illustrating a manufacturing process flow of rounding the ends of the top surface of a gate electrode having a sidewall formed on its side surface.

Hereinafter, a process of manufacturing a gate electrode will be described.

As in the first embodiment, a polysilicon film 103 having a gate electrode shape is formed by the same steps as those of FIGS. 1A to 1C.

As shown in FIG. 2A, the TEOS film 104 is then removed by wet etching, or removed by anisotropic dry etching after an insulating film for forming a sidewall 110 is deposited as necessary. The sidewall 110 is formed after extension implantation or the like. At this time, the top surface of the polysilicon film 103 has sharp ends 115. In other words, the ends of the top surface of the polysilicon film 103 have not been rounded yet. The sidewall 110 is formed by the same method as that of the first embodiment.

As shown in FIG. 2B, ion implantation is then conducted to source/drain regions 112. In order to form an N-type MOS transistor, quad implantation is conducted under the following conditions: ion species: arsenic (As); implantation energy: 50 KeV; dosage: $1\times10^{15}/cm^2$; and tilt angle: 45 degrees. In order to form a P-type MOS transistor, quad implantation is conducted under the following conditions: ion species: indium (In); implantation energy: 35 KeV; dosage: $1\times10^{15}/cm^2$; and tilt angle: 45 degrees.

By implantation of heavy ions (mass number of 28 or more), silicon atoms in the polysilicon film 103, especially those at the sharp ends 115 of the top surface of the polysilicon film 103, are sputtered and/or migrate. As a result, the ends 115 of the top surface of the polysilicon film 103 are rounded, and the rounded ends 108 are formed. In other words, silicon atoms are moved and/or ejected away due to collision with heavy ions. Such movement and/or ejection of silicon atoms is averaged in the portion of the polysilicon film 103 other than the sharp ends of the top surface of the polysilicon film 103. Therefore, nothing seems to have happened in the polysilicon film 103 macroscopically. In fact, however, the ends of the top surface of the polysilicon film 103 are rounded. The round radius (radius of curvature) 109 of the rounded portions 108 is about 20 nm to about 50 nm. The round radius 109 can be arbitrarily varied by varying an implantation species, implantation energy, a tilt angle, and the like.

In addition to the ion implantation for forming the rounded ends 108, ion implantation may be conducted with a plurality of ion species, a plurality of implantation energies, and a plurality of dosages in order to match an implantation profile with transistor capabilities (an implanted layer is not shown in the figures).

As in the first embodiment, silicidation is then conducted by a salicide process as shown in FIGS. 1F and 1G.

As in the first embodiment, in the gate electrode 131 having a silicide layer 114 thus formed, the bottom surface of the silicide layer 114 has an upward-convex circular arc shape. The top surface of the silicide layer 114 also has an upward-convex circular arc shape. A bottom surface of the silicide layer 114 has an approximately circular arc shape downward from a side end of the silicide layer 114 toward the center direction and a top surface of the silicide layer 114 has an approximately circular arc shape upward from a side end of the silicide layer 114 toward the center direction. Since both top and bottom surfaces of the silicide layer 114 have an upward-convex circular arc shape, the silicide layer 114 has an approximately uniform thickness in the cross section of FIG. 1G. Moreover, the gate electrode 131 having the silicide layer 114 has rounded ends at its top surface, and the shape of the rounded ends corresponds to the shape of the rounded ends 108 of the polysilicon film 103. Therefore, the rounded ends of the top surface of the gate electrode 131 have a radius of curvature (round radius) of 20 nm to 50 nm. The distance between the top end of the sidewall 110 and the top surface of the gate electrode 131 is 50 nm or less.

As in the first embodiment, problems which are caused by intensive application of film stresses can be prevented in the silicidation. In other words, cracking of the refractory metal 113 including a cap film, and insufficient diffusion of the refractory metal 113 into the polysilicon film 103 and insufficient diffusion of the polysilicon film 103 into the refractory metal 113 (insufficient silicidation) can be prevented. Therefore, the silicide layer 114 has a sufficient thickness even at the ends of the gate electrode 131 (i.e., even at the boundary with the sidewall 110) regardless of the gate width. It is assumed that a gate electrode (first gate electrode) 131 having a width of less than 150 nm as shown in FIG. 1G and a gate electrode (second gate electrode) 132 having a width of more than 500 nm as shown in FIG. 1G' are formed on a single substrate 101. In this case, of the thickness T(edge) of the silicide layer 114 of the first gate electrode 131 which is located in the boundary region with the sidewall 110, the thickness of the silicide layer 114 located below the top end of the sidewall 110 is 40% or more of the thickness T(center) of the silicide layer 114 in the middle of the second gate electrode 132 in the width direction. Since the silicide layer 114 has a sufficient thickness even at the ends of the gate electrode 131 (i.e., even at the boundary region with the sidewall 110) regardless of the gate width, variation in resistance within an individual gate electrode 131 and variation in resistance between a plurality of gate electrodes 131 are reduced.

In the above description, arsenic (As) is shown as an ion species for forming the rounded ends 108 for an N-type MOS transistor. However, the same effects can be obtained even when phosphorus (P), antimony (Sb), bismuth (Bi), or the like is used. Moreover, indium (In) is shown as an ion species for forming the rounded ends 108 for a P-type MOS transistor. However, the same effects can be obtained even when gallium (Ga), thallium (Tl), or the like is used. Instead of conducting ion implantation for introducing impurities, ion implantation may be conducted by using an element of Group IVB of the periodic table such as silicon (Si), germanium (Ge), tin (Sn), and lead (Pb) as an ion species. By such ion implantation, the same effect as that obtained by the ion implantation for introducing impurities can be obtained. In other words, the ends of the top surface of the polysilicon film 103 can be rounded. By using Si, the substrate (Si) which is consumed by silicidation can be supplemented. Moreover, by using heavier elements such as Ge, Sn, and Pb, the top portion of the gate electrode can be rounded efficiently. Note that when Si, Ge, Sn, or Pb is used as an ion species, N-type or P-type impurities are implanted separately.

In the present embodiment, the ends of the top surface of the polysilicon film 103 are efficiently rounded by conducting ion implantation under the following conditions:

(1) mass number of an ion species: 28 or more (equal to or larger than the mass number of Si); and (2) tilt angle: 0 to 85 degrees.

When the mass number of an ion species is 28 (Si atom) or more, Si atoms at the surface of the polysilicon film 103 are moved easily upon collision with the implanted ion species. The tilt angle can be determined as appropriate according to a desired radius of curvature of the ends of the top surface of the gate electrode. For example, the ends can be rounded most efficiently when the ion implantation is conducted at such a tilt angle that passes through the tip of the end to be rounded and the center of the circle inscribed with the top surface of the polysilicon film 103 and the side surface of the polysilicon film 103. In this case, the shape of the rounded end gets closer to a circular arc that passes through the center of the inscribed circle. Accordingly, when the polysilicon film 103 has a rectangular shape in a cross section perpendicular to the extending direction of the gate electrode, the end can be most efficiently rounded at a tilt angle of 45 degrees with respect to the substrate surface. When ions are implanted in a direction away from the direction passing thorough the tip of the end to be rounded and the center of the inscribed circle, the shape of the rounded end gets closer to a circular arc that passes through a point away from the center of the inscribed circle. Accordingly, when the polysilicon film 103 has a rectangular shape in a cross section perpendicular to the extending direction of the gate electrode, the ends of the polysilicon film 103 can be rounded more efficiently at a tilt angle of about 45±20 degrees with respect to the substrate surface. The ends of the polysilicon film 103 can be rounded at a tilt angle of 0 to 85 degrees with respect to the substrate surface. Since the amount by which silicon atoms (Si) at the surface of the polysilicon film are moved and the ion implantation depth are varied according to the tilt angle, the implantation energy is determined as appropriate in view of damages to the substrate.

In the present embodiment, the rounded ends 108 of the polysilicon film 103 are formed in both N-type and P-type MOS transistors. However, the rounded ends 108 may be formed in only one of N-type and P-type MOS transistors. The rounded ends 108 can be formed simultaneously with source/drain implantation without increasing the number of steps. Moreover, since the ends of the top surface of the polysilicon film can be rounded independently for an N-type MOS transistor and a P-type MOS transistor, the conditions for forming the rounded ends 108 can be determined more flexibly.

Alternatively, the ends of the top surface of the polysilicon film may be rounded by sputtering an ion species such as argon (Ar) before source/drain implantation.

Like the ion implantation, the ends of the top surface of the polysilicon film can be rounded efficiently when the sputtering is conducted under the following conditions:

(1) mass number of a sputtering species: 28 or more; and (2) sputtering incident angle: 0 to 85 degrees.

Reaction between an ion species and a material of the substrate may cause adverse effects to a device. Such adverse affects can be avoided by using a rare gas such as argon (Ar), xenon (Xe), krypton (Kr), and radon (Rn) as a sputtering ion species.

In the present embodiment, a hard mask (TEOS film 104) is used to form the polysilicon film 103 into a gate electrode shape. However, the same effects can be obtained even when the polysilicon film 103 is formed into a gate electrode shape by forming the resist 105 directly on the polysilicon film 103 and using the resist 105 as a resist mask for forming a gate pattern.

Third Embodiment

Hereinafter, a third embodiment of the present invention will be described with reference to the drawings. Note that description of the same steps, the same structure, and the same effects as those of the first embodiment will be omitted.

Figure 3A:
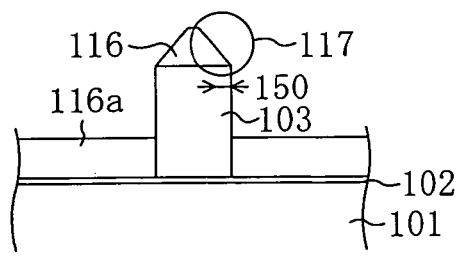
FIGS. 3A and 3B are cross-sectional views illustrating a manufacturing process flow of forming a silicided gate electrode according to a third embodiment of the present invention.
Figure 3B:
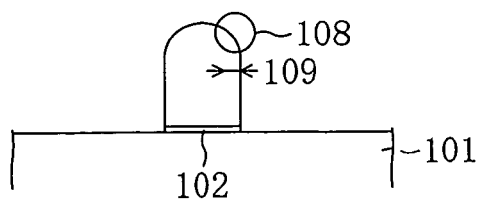

FIGS. 3A and 3B show a part of a method for manufacturing a semiconductor device of the third embodiment. FIGS. 3A and 3B are cross-sectional views illustrating a manufacturing process flow of siliciding a gate electrode. In this manufacturing process, a polysilicon film of a gate electrode shape is formed by etching, the ends of the top surface of the polysilicon film are rounded, and the gate electrode is then silicided.

Hereinafter, a process of manufacturing a gate electrode will be described.

First, a polysilicon film 103 having a gate electrode shape is formed by the same steps as those of FIGS. 1A to 1C of the first embodiment.

As shown in FIG. 3A, the TEOS film 104 is then removed by wet etching, or removed by anisotropic dry etching after an insulating film for forming a sidewall 110 is deposited as necessary. Thereafter, HDP-NSG (oxide films 116, 116a) is deposited with a thickness of about 50 nm to about 100 nm. When the thickness of the remaining TEOS film 104 is as thin as 30 nm or less, the TEOS film 104 need not necessarily be removed. Since HDP-NSG is formed while being sputtered, an oxide film 116 having a trapezoidal or triangle shape in a cross section perpendicular to the extending direction of the gate electrode and having a taper 117 is deposited on the polysilicon film 103. The lower end of the taper 117 matches the end of the top surface of the polysilicon film 103 in a self-aligned manner, and the taper 117 has an angle of about 45 degrees. At the same time, an oxide film 116a is deposited with a uniform thickness on the substrate 101. The oxide film 116 is preferably deposited so that the thickness of the oxide film 116 is at least a half of the narrowest gate width 106 on the substrate 101 and so that the thickness of the oxide film 116 is smaller than that of the oxide film 116a.

As shown in FIG. 3B, the tapered oxide film 116 and the oxide film 116a are etched back by anisotropic etching. This etchback process is conducted so that the oxide film 116a is not completely removed.

This etchback process is conducted under such conditions that the polysilicon film 103 is relatively easily etched. In this etchback process, the ends of the top surface of the polysilicon film 103 are rounded (rounded ends 108). The reason why the rounded ends 108 are formed is as follows: the corners of the ends of the top surface of the polysilicon film 103 are etched faster than a flat portion of the top surface of the polysilicon film 103, and the polysilicon film 103 is etched according to the shape of the tapers 107 of the TEOS film (hard mask) 104. A round radius (radius of curvature) 109 of the rounded ends 108 is about 15 nm to about 40 nm.

In order to form the rounded ends 108 having a circular arc shape, this etchback process is preferably conducted under multi-step conditions. For example, the ratio of the etching rate of the oxide film 116 to the etching rate of the polysilicon film 103 is made, for example, as low as about 0.5 to about 1 at the beginning of the step, and is gradually increased so that the polysilicon film 103 is less likely to be etched. In this way, a more exact circular arc shape can be obtained.

In this etchback process, when the thickness of the oxide film 116 is at least a half of the narrowest gate width on the substrate 101, a part of the oxide film 116a remains on the substrate 101 even after the oxide film 116 on the polysilicon film 103 is completely removed. Since the substrate 101 is protected by the oxide film 116a, the substrate 101 is hardly etched. Therefore, this polysilicon film 103 does not degrade transistor capabilities. After this etchback process, the oxide film 116a is removed by hydrofluoric acid or the like.

As in the first embodiment, a sidewall 110 is then formed after extension implantation or the like as shown in FIG. 1E. As in the first embodiment, silicidation is then conducted by an ion implantation process and a salicide process as shown in FIGS. 1F and 1G.

As in the first embodiment, in the gate electrode 131 having a silicide layer 114 thus formed, the bottom surface of the silicide layer 114 has an upward-convex circular arc shape. The top surface of the silicide layer 114 also has an upward-convex circular arc shape. A bottom surface of the silicide layer 114 has an approximately circular arc shape downward from a side end of the silicide layer 114 toward the center direction and a top surface of the silicide layer 114 has an approximately circular arc shape upward from a side end of the silicide layer 114 toward the center direction. Since both top and bottom surfaces of the silicide layer 114 have an upward-convex circular arc shape, the silicide layer 114 has an approximately uniform thickness in the cross section of FIG. 1G. Moreover, the gate electrode 131 having the silicide layer 114 has rounded ends at its top surface, and the shape of the rounded ends corresponds to the shape of the rounded ends 108 of the polysilicon film 103. Therefore, the rounded ends of the top surface of the gate electrode 131 have a radius of curvature (round radius) of 20 nm to 50 nm. The distance between the top end of the sidewall 110 and the top surface of the gate electrode 131 is 50 nm or less.

As in the first embodiment, problems which are caused by intensive application of film stresses can be prevented in the silicidation. In other words, cracking of the refractory metal 113 including a cap film, and insufficient diffusion of the refractory metal 113 into the polysilicon film 103 and insufficient diffusion of the polysilicon film 103 into the refractory metal 113 (insufficient silicidation) can be prevented. Therefore, the silicide layer 114 has a sufficient thickness even at the ends of the gate electrode 131 (i.e., even at the boundary with the sidewall 110) regardless of the gate width. It is assumed that a gate electrode (first gate electrode) 131 having a width of less than 150 nm as shown in FIG. 1G and a gate electrode (second gate electrode) 132 having a width of more than 500 nm as shown in FIG. 1G' are formed on a single substrate 101. In this case, of the thickness T(edge) of the silicide layer 114 of the first gate electrode 131 which is located in the boundary region with the sidewall 110, the thickness of the silicide layer 114 located below the top end of the sidewall 110 is 40% or more of the thickness T(center) of the silicide layer 114 in the middle of the second gate electrode 132 in the width direction. Since the silicide layer 114 has a sufficient thickness even at the ends of the gate electrode 131 (i.e., even at the boundary region with the sidewall 110) regardless of the gate width, variation in resistance within an individual gate electrode 131 and variation in resistance between a plurality of gate electrodes 131 are reduced.

Fourth Embodiment

Hereinafter, a fourth embodiment of the present invention will be described with reference to the drawings. Note that description of the same steps, the same structure, and the same effects as those of the first embodiment will be omitted.

FIGS. 4A to 4D' show a part of a method for manufacturing a semiconductor device of the fourth embodiment. FIGS. 4A to 4D are cross-sectional views illustrating a manufacturing process flow of forming a silicided gate electrode. In this manufacturing process, etching for forming a polysilicon film into a gate electrode shape is discontinued before the polysilicon film has a complete gate electrode shape. After the etching is discontinued, polysilicon is deposited and additional etching is conducted to round the ends of the top surface of the gate electrode are rounded. The gate electrode is thus silicided.

Hereinafter, a process of manufacturing a gate electrode will be described.

As in the first embodiment, a TEOS film 104, a hard mask, is first formed on a polysilicon film 103 by the same steps as those of FIGS. 1A and 1B. This polysilicon film 103 is a first silicon layer.

Figure 4A:
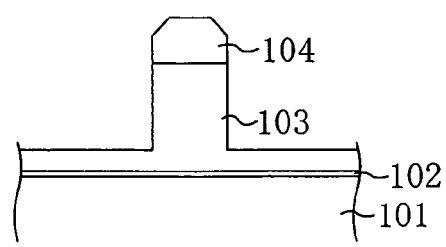
FIGS. 4A, 4B, 4C, 4D, and 4D' are cross-sectional views illustrating a manufacturing process flow of forming a silicided gate electrode according to a fourth embodiment of the present invention.

As shown in FIG. 4A, first etching of the polysilicon film 103 is conducted. This etching is discontinued before the polysilicon film 103 has a complete gate electrode shape. In other words, this etching is discontinued with the whole surface of the substrate 101 being covered with the polysilicon film 103 so that the etching does not reach the gate insulating film 102. When the etching is discontinued, the polysilicon film 103 remaining on the gate insulating film 102 has a thickness of about 5 nm to about 50 nm in the region other than the region where the gate electrode is to be formed. This thickness is preferably made as thin as possible. When the polysilicon film 103 remaining on the gate insulating film 102 in this region is thinner, the etching amount in second etching becomes smaller, and therefore, the gate width is less likely to vary during etching.

Figure 4B:
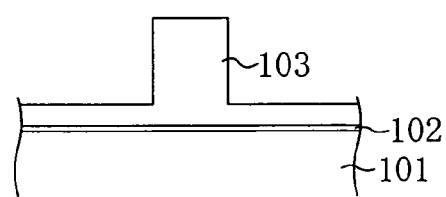

As shown in FIG. 4B, the TEOS film 104 (hard mask) on the polysilicon film 103 then removed by etching. Since the surface of the substrate 101 is covered by the remaining polysilicon film 103, this etching can be conducted either by a dry etching method or a wet etching method. This etching is conducted under such conditions that the polysilicon film 103 which is to be formed into a gate electrode is not etched.

Figure 4C:
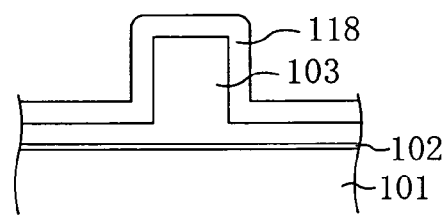

As shown in FIG. 4C, a second polysilicon film 118 is deposited on the whole surface of the polysilicon film 103. The thickness of the second polysilicon layer 118 is determined according to the required round radius (radius of curvature) of the rounded ends of the top surface of the gate electrode. For example, the thickness of the second polysilicon layer 118 is about 10 nm to about 30 nm. The top surface of the second polysilicon layer 118 has rounded ends.

Figure 4D:
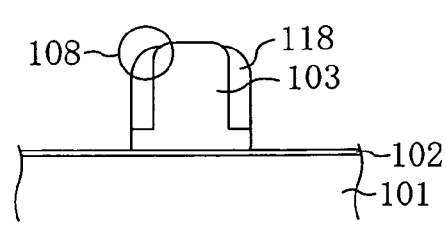
Figure 4D:
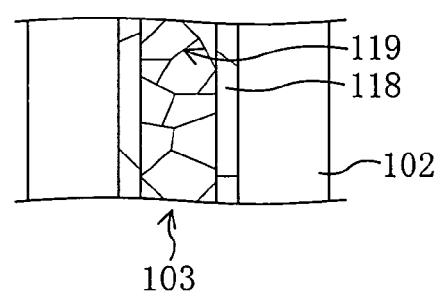

As shown in FIG. 4D, the second polysilicon film 118 is then etched back (second etching). This etchback process is conducted until the gate insulating film 102 is exposed. As a result, the round radius of the rounded ends of the second polysilicon layer 118 is increased to about 15 nm to about 40 nm.

FIG. 4D' is a top view of the gate electrode shown in FIG. 4D.

As shown in FIG. 4D', grain boundaries 119 of polysilicon are randomly present in the polysilicon film 103 and the second polysilicon layer 118, and two grain boundaries 119 are always present between the polysilicon film 103 and the second polysilicon layer 118. In a silicidation process, a silicide layer is likely to split along grain boundaries due to tensile stresses. When the split line of the silicide layer extends in the width direction of the gate electrode, resistance in the extending direction of the gate electrode is increased. In the present embodiment, however, silicide formation along the grain boundaries 119 is facilitated. Therefore, the split line extending in the width direction of the gate electrode is disconnected by the grain boundaries 119 at the interface between the polysilicon film 103 and the second polysilicon 118. As a result, increase in resistance of the gate electrode due to splitting of the silicide layer in the width direction can be suppressed.

In the following description of the present embodiment, the second polysilicon film 118 is regarded as integral with the polysilicon film 103, and is described as the polysilicon film 103.

As in the first embodiment, a sidewall 110 is then formed after extension implantation or the like as shown in FIG. 1E. As in the first embodiment, silicidation is then conducted by an ion implantation process and a salicide process as shown in FIGS. 1F and 1G.

As in the first embodiment, in the gate electrode 131 having a silicide layer 114 formed as such, the bottom surface of the silicide layer 114 has an upward-convex circular arc shape. The top surface of the silicide layer 114 also has an upward-convex circular arc shape. A bottom surface of the silicide layer 114 has an approximately circular arc shape downward from a side end of the silicide layer 114 toward the center direction and a top surface of the silicide layer 114 has an approximately circular arc shape upward from a side end of the silicide layer 114 toward the center direction. Since both top and bottom surfaces of the silicide layer 114 have an upward-convex circular arc shape, the silicide layer 114 has an approximately uniform thickness in the cross section of FIG. 1G. Moreover, the gate electrode 131 having the silicide layer 114 has rounded ends at its top surface, and the shape of the rounded ends corresponds to the shape of the rounded ends 108 of the polysilicon film 103. Therefore, the rounded ends of the top surface of the gate electrode 131 have a radius of curvature (round radius) of 20 nm to 50 nm. The distance between the top end of the sidewall 110 and the top surface of the gate electrode 131 is 50 nm or less.

As in the first embodiment, problems which are caused by intensive application of film stresses can be prevented in the silicidation. In other words, cracking of the refractory metal 113 including a cap film, and insufficient diffusion of the refractory metal 113 into the polysilicon film 103 and insufficient diffusion of the polysilicon film 103 into the refractory metal 113 (insufficient silicidation) can be prevented. Therefore, the silicide layer 114 has a sufficient thickness even at the ends of the gate electrode 131 (i.e., even at the boundary with the sidewall 110) regardless of the gate width. It is assumed that a gate electrode (first gate electrode) 131 having a width of less than 150 nm as shown in FIG. 1G and a gate electrode (second gate electrode) 132 having a width of more than 500 nm as shown in FIG. 1G' are formed on a single substrate 101. In this case, of the thickness T(edge) of the silicide layer 114 of the first gate electrode 131 which is located in the boundary region with the sidewall 110, the thickness of the silicide layer 114 located below the top end of the sidewall 110 is 40% or more of the thickness T(center) of the silicide layer 114 in the middle of the second gate electrode 132 in the width direction. Since the silicide layer 114 has a sufficient thickness even at the ends of the gate electrode 131 (i.e., even at the boundary region with the sidewall 110) regardless of the gate width, variation in resistance within an individual gate electrode 131 and variation in resistance between a plurality of gate electrodes 131 are reduced.

In the present embodiment, an amorphous silicon film may be formed on the polysilicon film 103 instead of the second polysilicon film 118. Depending on the transistor design, an amorphous silicon film may be used instead of the first polysilicon film 103. Both the first and second silicon films may be amorphous silicon films. Alternatively, at least one of the first and second silicon films may be a doped polysilicon film or a doped amorphous silicon film.

When the first and second silicon films are amorphous silicon films, grain size is increased due to crystallization of amorphous silicon in a later heat treatment process. Therefore, grain boundaries 119 are likely to be generated. However, the connection between the grain boundaries 119 is disconnected by the interface between the first and second silicon films. Accordingly, the silicide layer is less likely to split in the width direction along the grain boundaries 119. As a result, increase in resistance of the gate electrode 131 resulting from such splitting of the silicide layer can be suppressed.

Moreover, when the first and second silicon films are amorphous silicon films, an oxide film which is formed by a later ashing process has an increased thickness. Therefore, silicide formation can be suppressed. In other words, in the amorphous silicon film having a gate electrode shape, silicide reaction is likely to proceed faster in the ends of the top surface than in the middle of the top surface. As a result, the difference in silicide thickness between the end and the middle of the top surface of the amorphous silicon film can be reduced.

Note that even when the silicon layer of the gate electrode is formed from the first and second silicon layers, only the first polysilicon film 103 contacts the gate insulating film 102 in the present embodiment. In other words, the interface with the gate insulating film 102 that relates to driving capabilities of transistors has the same structure as that of a normal gate electrode having a single layer structure. Therefore, design values such as a transistor threshold value do not deviate much from conventional design values.

The width 106 of the gate electrode 131 is the sum of the width of the polysilicon film 103 after the first etching and twice the deposition thickness of the second polysilicon film 118. Accordingly, the width of the polysilicon film 103 after the first etching may be designed as a desired width 106 of the gate electrode 131 minus twice the deposition thickness of the second polysilicon film 118. Alternatively, the polysilicon film 103 may be thinned by isotropic etching before the second polysilicon film 118 is deposited in FIG. 4C.

Fifth Embodiment

Hereinafter, a fifth embodiment of the present invention will be described with reference to the drawings. Note that description of the same steps, the same structure, and the same effects as those of the first or second embodiment will be omitted.

Figure 5A:
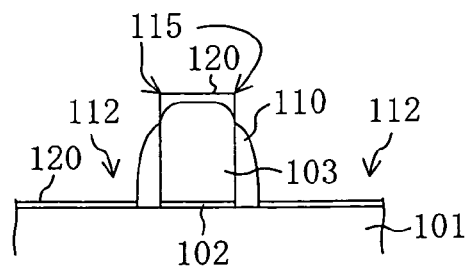
FIGS. 5A and 5B are cross-sectional views illustrating a manufacturing process flow of forming a silicided gate electrode according to a fifth embodiment of the present invention.
Figure 5B:
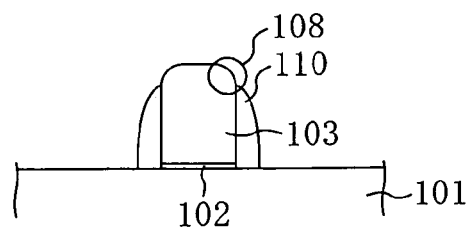

FIGS. 5A and 5B show a part of a method for manufacturing a semiconductor device of the fifth embodiment. FIGS. 5A and 5B are cross-sectional views illustrating a manufacturing process flow of forming a silicided gate electrode. In this manufacturing process, after a sidewall 110 is formed, heat treatment for activating source/drain implantation is conducted simultaneously with oxidation of the polysilicon film 103 to be formed into a gate electrode. By removing the oxide layer, the ends of the top surface of the gate electrode are rounded, whereby the silicided gate electrode is formed.

Hereinafter, a process of manufacturing a gate electrode will be described.

As in the first embodiment, a polysilicon film 103 having a gate electrode shape is formed by the same steps as those of FIGS. 1A to 1C.

As in the second embodiment, as shown in FIG. 2A, the TEOS film 104 is then removed by wet etching, or removed by anisotropic dry etching after an insulating film for forming a sidewall 110 is deposited as necessary. The sidewall 110 is formed after extension implantation or the like. When the thickness of the remaining TEOS film 104 is as thin as 30 nm or less, the TEOS film 104 need not necessarily be removed. At this time, the top surface of the polysilicon film 103 has sharp ends 115. In other words, the ends of the top surface of the polysilicon film 103 have not been rounded yet.

Ion implantation is then conducted to the source/drain regions 112 by the same method as that of the first embodiment. The ends of the top surface of the polysilicon film 103 are still sharp even after the ion implantation.

As shown in FIG. 5A, heat treatment is then conducted in an atmosphere of oxygen gas or steam gas in order to activate the ion species implanted by the ion implantation. The surface of the polysilicon film 103 and the source/drain regions 112 of the substrate 101 are oxidized in this heat treatment. Since the polysilicon film 103 is formed from polysilicon, the resultant oxide film 120 is thicker on the polysilicon film 103 than on the substrate 101. The ion implantation accelerates oxidation of the substrate 101 and the polysilicon film 103. Moreover, the ends 115 of the top surface of the polysilicon film 103 are oxidized from both the top and the side. Therefore, oxidation of the top surface of the polysilicon film 103 proceeds faster at the ends 115 than in the middle. As a result, the oxide film formed at the top surface of the polysilicon film 103 is thicker at the ends 115 than in the middle.

As shown in FIG. 5B, the oxide film 120 formed at the top surface of the polysilicon film 103 and at the top surface of the source/drain regions 102 is then removed by hydrofluoric acid. Since the oxide film 120 formed at the top surface of the polysilicon film 103 is thicker at the ends than in the middle, rounded ends 108 are formed at the top surface of the polysilicon film 103 by removing the oxide film 120.

As in the first embodiment, silicidation is then conducted by an ion implantation process and a salicide process as shown in FIGS. 1F and 1G.

As in the first embodiment, in the gate electrode 131 having a silicide layer 114 formed as such, the bottom surface of the silicide layer 114 has an upward-convex circular arc shape. The top surface of the silicide layer 114 also has an upward-convex circular arc shape. A bottom surface of the silicide layer 114 has an approximately circular arc shape downward from a side end of the silicide layer 114 toward the center direction and a top surface of the silicide layer 114 has an approximately circular arc shape upward from a side end of the silicide layer 114 toward the center direction. Since both top and bottom surfaces of the silicide layer 114 have an upward-convex circular arc shape, the silicide layer 114 has an approximately uniform thickness in the cross section of FIG. 1G. Moreover, the gate electrode 131 having the silicide layer 114 has rounded ends at its top surface, and the shape of the rounded ends corresponds to the shape of the rounded ends 108 of the polysilicon film 103. Therefore, the rounded ends of the top surface of the gate electrode 131 have a radius of curvature (round radius) of 20 nm to 50 nm. The distance between the top end of the sidewall 110 and the top surface of the gate electrode 131 is 50 nm or less.

As in the first embodiment, problems which are caused by intensive application of film stresses can be prevented in the silicidation. In other words, cracking of the refractory metal 113 including a cap film, and insufficient diffusion of the refractory metal 113 into the polysilicon film 103 and insufficient diffusion of the polysilicon film 103 into the refractory metal 113 (insufficient silicidation) can be prevented. Therefore, the silicide layer 114 has a sufficient thickness even at the ends of the gate electrode 131 (i.e., even at the boundary with the sidewall 110) regardless of the gate width. It is assumed that a gate electrode (first gate electrode) 131 having a width of less than 150 nm as shown in FIG. 1G and a gate electrode (second gate electrode) 132 having a width of more than 500 nm as shown in FIG. 1G' are formed on a single substrate 101. In this case, of the thickness T(edge) of the silicide layer 114 of the first gate electrode 131 which is located in the boundary region with the sidewall 110, the thickness of the silicide layer 114 located below the top end of the sidewall 110 is 40% or more of the thickness T(center) of the silicide layer 114 in the middle of the second gate electrode 132 in the width direction. Since the silicide layer 114 has a sufficient thickness even at the ends of the gate electrode 131 (i.e., even at the boundary region with the sidewall 110) regardless of the gate width, variation in resistance within an individual gate electrode 131 and variation in resistance between a plurality of gate electrodes 131 are reduced.

Ion implantation to the source/drain regions is preferably conducted with high-concentration impurities ($1 \times 10^{15}$ $cm^{-2}$). When an ion species is implanted at a high concentration into the vicinity of the surface of the polysilicon film 103 (the depth of about 5 nm to about 50 nm from the surface), an oxide film which is formed by heat treatment is thicker than that which is formed when an ion species is not implanted at a high concentration (that is, when an ion species is implanted at a medium or low concentration). Therefore, the ends of the top surface of the polysilicon oxide film 103 are rounded more, whereby the rounded ends 108 have a greater radius of curvature.

Sixth Embodiment

Hereinafter, a sixth embodiment of the present invention will be described with reference to the drawings. Note that description of the same steps, the same structure, and the same effects as those of the first embodiment will be omitted.

Figure 6A:
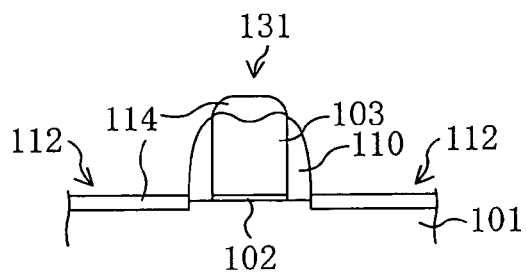
FIGS. 6A, 6B, 6C, and 6C' are cross-sectional views illustrating a manufacturing process flow of forming a silicided gate electrode according to a sixth embodiment of the present invention.
Figure 6B:
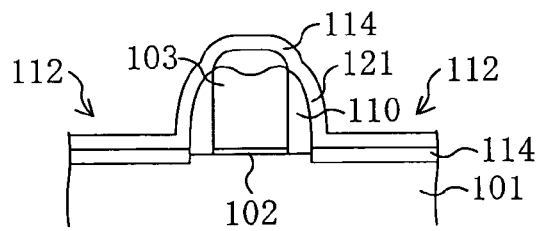
Figure 6C:
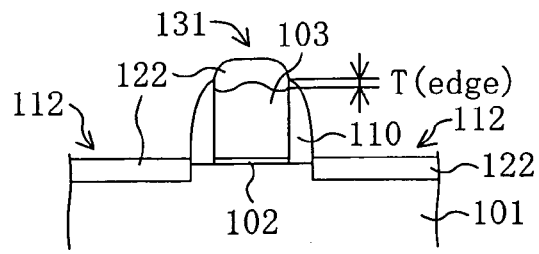
Figure 6C:
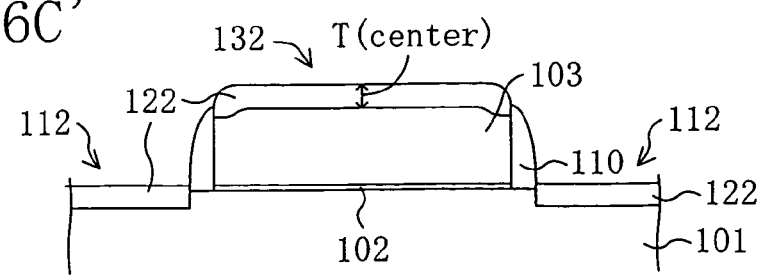

FIGS. 6A to 6C' show a part of a method for manufacturing a semiconductor device of the sixth embodiment. In the sixth embodiment, silicidation is conducted twice. In the first silicidation, due to the sharp ends of the top surface of the polysilicon film, silicide is less likely to be formed at the ends of the top surface of the polysilicon film and is more likely to be formed in the middle of the top surface of the polysilicon film. The silicide material therefore moves towards the middle of the top surface of the polysilicon film. Accordingly, the ends of the top surface of the gate electrode are rounded as a result of the first silicidation. However, the silicide film has an uneven thickness. In other words, the silicide film is thinner at the ends and thicker in the middle.

In the second silicidation, silicide is formed in the surface of the gate electrode which has been rounded by the first silicidation.

Hereinafter, a process of manufacturing a gate electrode will be described.

As in the first embodiment, a polysilicon film 103 having a gate electrode shape is formed by the same steps as those of FIGS. 1A to 1C.

As in the second embodiment, as shown in FIG. 2A, the TEOS film 104 is then removed by wet etching, or removed by anisotropic dry etching after an insulating film for forming a sidewall 110 is deposited as necessary. The sidewall 110 is formed after extension implantation or the like. Note that when the thickness of the remaining TEOS film 104 is as thin as 30 nm or less, the TEOS film 104 need not necessarily be removed. At this time, the top surface of the polysilicon film 103 has sharp ends 115. In other words, the ends of the top surface of the polysilicon film 103 have not been rounded yet. The sidewall 110 is formed by the same method as that of the first embodiment.

As in the first embodiment, as shown in FIG. 1F, a refractory metal 113 is then deposited on the whole surface of the substrate 101. In the sixth embodiment, the deposition thickness of the refractory metal 113 is smaller than that in the first embodiment. For example, the refractory metal 113 is deposited with a half of a conventional thickness.

As shown in FIG. 6A, a salicide process is then conducted. More specifically, the substrate 101 having the refractory metal 113 deposited thereon is heat-treated in an inert gas atmosphere in order to form a silicide layer 114 at the top surface of the gate electrode 131 and at the surface of the source/drain regions 112.

In this heat treatment, film stresses are generated due to the difference in coefficient of thermal expansion between the refractory metal 113 and the polysilicon film 103 and the sidewall 110. Especially when the polysilicon film 103 has sharp ends at its top surface, the film stresses are intensively applied to these ends. In this case, the refractory metal 113 including a cap film that serves as an anti-oxidation film in the heat treatment cracks and the refractory metal 113 is prevented from thermally diffusing into the polysilicon film 103. Therefore, the resultant silicide layer 114 does not have a sufficient thickness at the ends of the top surface of the polysilicon film 103. In other words, the silicide layer 114 formed at the top surface of the polysilicon film 103 is thin at the ends and is thick in the middle when viewed in cross section. Moreover, the top surface of the polysilicon film 103 is less likely to be silicided at the ends and is more likely to be silicided in the middle. Therefore, the material of the polysilicon film 103 (i.e., silicon atoms) moves toward the middle of the top surface of the polysilicon film 103.

The unreacted refractory metal 113 is then removed so that only the silicide layer 114 is left. As described above, silicon atoms at the ends of the top surface of the polysilicon film 103 move toward the middle of the top surface of the polysilicon film 103 in the silicidation. As a result, the ends of the top surface of the polysilicon film 103 which are less likely to be silicided are rounded, and the top surface of the gate electrode 131 including the silicide layer 114 has a gently rounded shape (upward concave).

As shown in FIG. 6B, in order to conduct the second silicidation, a second refractory metal 121 (such as cobalt) including a cap film is deposited on the whole surface of the substrate 101 including the source/drain regions 112 and the gate electrode 131 having the silicide layer 114. The second refractory metal 121 is deposited with a small thickness. For example, the second refractory metal 121 is deposited with a half of a thickness used in a conventional method in which a silicide layer is formed by a single silicidation.

As shown in FIG. 1G, heat treatment is then conducted in an inert gas atmosphere by a salicide process in order to form a silicide layer 122 at the top surface of the gate electrode 131 and at the surface of the source/drain regions 112. In this heat treatment, film stresses are generated due to the difference in coefficient of thermal expansion between the second refractory metal 121 and the polysilicon film 103 and the sidewall 110. However, since the gate electrode 131 has rounded ends, the film stresses are less likely to be intensively applied to the ends. Moreover, since the gate surface profile including the polysilicon film 103 and the sidewall 110 is not so angular, the film stresses are less likely to be intensively applied to a specific portion. Accordingly, problems which are caused by intensive application of film stresses can be prevented. In other words, cracking of the second refractory metal 121, and insufficient diffusion of the second refractory metal 121 into the gate electrode 131 and insufficient diffusion of the gate electrode 131 into the second refractory metal 121 (insufficient silicidation) can be prevented. Note that the cap film is present on the surface of the second refractory metal 121, but is shown to be included in the second refractory metal 121 in FIG. 6B. Therefore, the cap film is not shown in FIG. 6B.

The unreacted second refractory metal 121 remaining on the silicide layer 122 is then removed so that only the silicide layer 122 is left. Note that the silicide layer 122 is formed from two layers.

As in the first embodiment, in the gate electrode 131 having the silicide layer 122 thus formed, the bottom surface of the silicide layer 122 has an upward-convex circular arc shape. The top surface of the silicide layer 122 also has an upward-convex circular arc shape. A bottom surface of the silicide layer 122 has an approximately circular arc shape downward from a side end of the silicide layer 122 toward the center direction and a top surface of the silicide layer 122 has an approximately circular arc shape upward from a side end of the silicide layer 122 toward the center direction. Since both top and bottom surfaces of the silicide layer 122 have an upward-convex circular arc shape, the silicide layer 122 has an approximately uniform thickness in the cross section of FIG. 6C. Moreover, the gate electrode 131 having the silicide layer 122 has rounded ends at its top surface, and the shape of the rounded ends corresponds to the shape of the rounded ends of the top surface of the silicide film 114. Therefore, the rounded ends of the top surface of the gate electrode 131 have a radius of curvature (round radius) of 20 nm to 50 nm. The distance between the top end of the sidewall 110 and the top surface of the gate electrode 131 is 50 nm or less.

As in the first embodiment, problems which are caused by intensive application of film stresses can be prevented in the second silicidation. In other words, cracking of the second refractory metal 121 including the cap film, and insufficient diffusion of the second refractory metal 121 into the polysilicon film 103 and insufficient diffusion of the polysilicon film 103 into the second refractory metal 121 (insufficient silicidation) can be prevented. Therefore, the silicide layer 122 has a sufficient thickness even at the ends of the gate electrode 131 (i.e., even at the boundary with the sidewall 110) regardless of the gate width. It is assumed that a gate electrode (first gate electrode) 131 having a width of less than 150 nm as shown in FIG. 6C and a gate electrode (second gate electrode) 132 having a width of more than 500 nm as shown in FIG. 6C' are formed on a single substrate 101. In this case, of the thickness T(edge) of the silicide layer 122 of the first gate electrode 131 which is located in the boundary region with the sidewall 110, the thickness of the silicide layer 122 located below the top end of the sidewall 110 is 40% or more of the thickness T(center) of the silicide layer 122 in the middle of the second gate electrode 132 in the width direction. Since the silicide layer 122 has a sufficient thickness even at the ends of the gate electrode 131 (i.e., even at the boundary region with the sidewall 110) regardless of the gate width, variation in resistance within an individual gate electrode 131 and variation in resistance between a plurality of gate electrodes 131 are reduced.

In the present embodiment, cobalt is used as the refractory metals 113 and 121. However, the present invention is not limited to this. The refractory metals 113 and 121 may be any metal having a melting point of 1,400° C. or higher such as titanium, nickel, tungsten, molybdenum, tantalum, chromium, palladium, platinum, and the like. The refractory metals 113 and 121 may be metals of different kinds.

In the first silicidation, heat treatment for reducing silicide resistance may be conducted after the process of removing the unreacted refractory metal 113 so that only the silicide layer 114 is left.

Seventh Embodiment

Hereinafter, a seventh embodiment of the present invention will be described with reference to the drawings. Note that description of the same steps, the same structure, and the same effects as those of the first embodiment will be omitted.

Figure 7A:
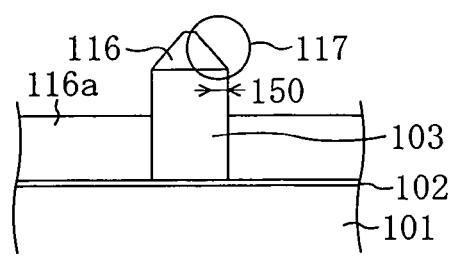
FIGS. 7A and 7B are cross-sectional views illustrating a manufacturing process flow of forming a silicided gate electrode according to a seventh embodiment of the present invention.
Figure 7B:
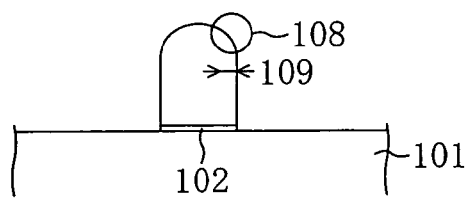

FIGS. 7A and 7B show a part of a method for manufacturing a semiconductor device of the seventh embodiment. FIGS. 7A and 7B are cross-sectional views illustrating a manufacturing process flow of forming a silicided gate electrode. In this manufacturing process, a polysilicon film having a gate electrode shape is rounded by a CMP (Chemical Mechanical Polish) process.

Hereinafter, a process of manufacturing a gate electrode of the present embodiment will be described.

As in the first embodiment, a polysilicon film 103 having a gate electrode shape is first formed by the same steps as those of FIGS. 1A to 1C.

The TEOS film 104 is then removed by wet etching, or removed by anisotropic dry etching after an insulating film for forming a sidewall 110 is deposited as necessary. Thereafter, as shown in FIG. 7A, HDP-NSG (oxide films 116, 116a) having a thickness of about 50 nm to about 100 nm is deposited on the whole surface of the substrate 101. Note that when the thickness of the remaining TEOS film 104 is as thin as 30 nm or less, the TEOS film 104 need not necessarily be removed. Since HDP-NSG is formed while being sputtered, an oxide film 116 having a trapezoidal or triangle shape in a cross section perpendicular to the extending direction of the gate electrode and having a taper 117 is deposited on the polysilicon film 103. The lower end of the taper 117 matches the end of the top surface of the polysilicon film 103 in a self-aligned manner, and the taper 117 has an angle of about 45 degrees. At the same time, an oxide film 116a is deposited with a uniform thickness on the substrate 101. The oxide film 116a on the thin thermal oxide film 102 is deposited with such a thickness that the polysilicon film 103 does not fall in the following CMP process. More specifically, the thickness of the oxide film 116a on the thin thermal oxide film 102 is at least a half of the thickness of the polysilicon film 103, and is smaller than the height of the polysilicon film 103. In other words, the thickness of the oxide film 116a on the thin thermal oxide film 102 is preferably 50% or more and less than 100% of the thickness of the polysilicon film 103.

As shown in FIG. 7B, the top surface of the polysilicon film 103 including HDP-NSG is then polished by a CMP process.

The CMP process is conducted under such conditions that the polysilicon film 103 and the oxide film 116 are polished simultaneously. Therefore, the top surface of the polysilicon film 103 is polished, and rounded ends 108 are formed. Such rounded ends 108 are formed because the oxide film 116 on the polysilicon film 103 has the taper 117 and because a polishing pad of the CMP process bends slightly. The substrate 101 is protected by the oxide film 116a and therefore is not polished in this process. The rounded ends 108 have a round radius (radius of curvature) 109 of about 15 nm to about 40 nm. Note that the radius of curvature can be arbitrarily varied according to the thickness of the oxide film 116 and the conditions of the CMP process. A softer polishing pad can be used in the CMP process in order to increase the round radius 109.

The oxide film 116a is then removed by hydrofluoric acid or the like.

As in the first embodiment, as shown in FIG. 1E, a sidewall 110 is then formed after extension implantation or the like. As in the first embodiment, silicidation is then conducted by an ion implantation process and a salicide process as shown in FIGS. 1F and 1G.

As in the first embodiment, in the gate electrode 131 having a silicide layer 114 thus formed, the bottom surface of the silicide layer 114 has an upward-convex circular arc shape. The top surface of the silicide layer 114 also has an upward-convex circular arc shape. A bottom surface of the silicide layer 114 has an approximately circular arc shape downward from a side end of the silicide layer 114 toward the center direction and a top surface of the silicide layer 114 has an approximately circular arc shape upward from a side end of the silicide layer 114 toward the center direction. Since both top and bottom surfaces of the silicide layer 114 have an upward-convex circular arc shape, the silicide layer 114 has an approximately uniform thickness in the cross section of FIG. 1G. Moreover, the gate electrode 131 having the silicide layer 114 has rounded ends at its top surface, and the shape of the rounded ends corresponds to the shape of the rounded ends 108 of the polysilicon film 103. Therefore, the rounded ends of the top surface of the gate electrode 131 have a radius of curvature (round radius) of 20 nm to 50 nm. The distance between the top end of the sidewall 110 and the top surface of the gate electrode 131 is 50 nm or less.

As in the first embodiment, problems which are caused by intensive application of film stresses can be prevented in the silicidation. In other words, cracking of the refractory metal 113 including a cap film, and insufficient diffusion of the refractory metal 113 into the polysilicon film 103 and insufficient diffusion of the polysilicon film 103 into the refractory metal 113 (insufficient silicidation) can be prevented. Therefore, the silicide layer 114 has a sufficient thickness even at the ends of the gate electrode 131 (i.e., even at the boundary with the sidewall 110) regardless of the gate width. It is assumed that a gate electrode (first gate electrode) 131 having a width of less than 150 nm as shown in FIG. 1G and a gate electrode (second gate electrode) 132 having a width of more than 500 nm as shown in FIG. 1G' are formed on a single substrate 101. In this case, of the thickness T(edge) of the silicide layer 114 of the first gate electrode 131 which is located in the boundary region with the sidewall 110, the thickness of the silicide layer 114 located below the top end of the sidewall 110 is 40% or more of the thickness T(center) of the silicide layer 114 in the middle of the second gate electrode 132 in the width direction. Since the silicide layer 114 has a sufficient thickness even at the ends of the gate electrode 131 (i.e., even at the boundary region with the sidewall 110) regardless of the gate width, variation in resistance within an individual gate electrode 131 and variation in resistance between a plurality of gate electrodes 131 are reduced.

Eighth Embodiment

Hereinafter, an eighth embodiment of the present invention will be described with reference to the drawings. Note that description of the same steps, the same structure, and the same effects as those of the first embodiment will be omitted.

Figure 8A:
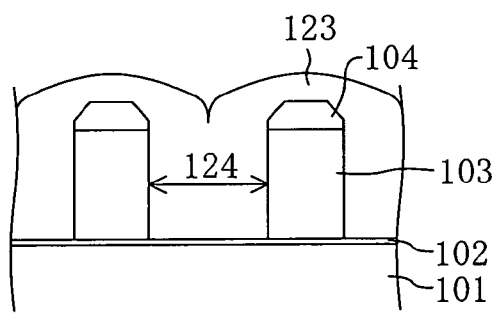
FIGS. 8A, 8B, and 8C are cross-sectional views illustrating a manufacturing process flow of forming a silicided gate electrode according to an eighth embodiment of the present invention.
Figure 8B:
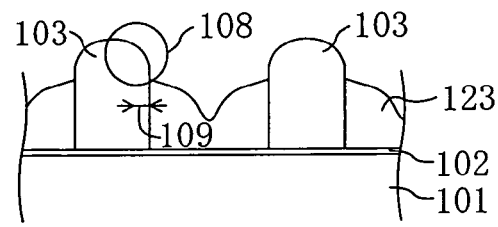
Figure 8C:
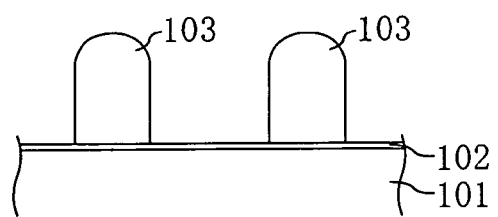

FIGS. 8A to 8C show a part of a method for manufacturing a semiconductor device of the eighth embodiment. Hereinafter, a process of manufacturing a gate electrode of the present embodiment will be described.

As in the first embodiment, a polysilicon film 103 having a gate electrode shape is formed by the same steps as those of FIGS. 1A to 1C.

As shown in FIG. 8A, a boron phosphorus silicate glass (BPSG) film 123 is deposited on the whole surface of the substrate 101. The thickness of the BPSG film 123 is slightly less than a half of a distance 124 between two adjacent polysilicon films 103, 103 having a gate electrode shape (the distance 124 is approximately the same as the distance between gate electrodes). By heat treatment, the BPSG film 123 is then partially melted to flow. Due to the original thickness of the BPSG film 123, the thickness of the BPSG film 123 becomes greater between the adjacent polysilicon films 103, 103 than on the polysilicon films 103 as a result of the heat treatment. In other words, the BPSG film 123 fills the space between the adjacent polysilicon films 103, 103 as a result of the heat treatment. Since the BPSG film 123 is caused to flow by the heat treatment, the BPSG film 123 has a gently rounded shape on the polysilicon films 103.

As shown in FIG. 8B, the BPSG film 123, the TEOS film 104, and the top portion of the polysilicon films 103 are etched back by anisotropic etching until the BPSG film 123 on the polysilicon films 103 is removed and the top surface of the BPSG film 123 becomes lower than the top surface of the polysilicon films 103.

This etchback process is conducted under such conditions that the polysilicon films 103 are relatively easily etched. More specifically, this etchback process is conducted under the following conditions: pressure: 5 Pa to 20 Pa; power: 100 W to 200 W; and gas flow ratio: $CHF_3:O_2=1:0.01$ to $0.05$. This etchback process forms rounded ends 108 of the polysilicon films 103.

Since the substrate 101 is protected by the BPSG film 123, the substrate 101 is hardly etched in this etchback process. Accordingly, this etchback process does not degrade capabilities of transistors having these polysilicon films 103.

As shown in FIG. 8C, the BPSG film 123 is then removed with hydrofluoric acid or the like.

As in the first embodiment, as shown in FIG. 1E, a sidewall 110 is then formed after extension implantation or the like. As in the first embodiment, silicidation is then conducted by an ion implantation process and a salicide process as shown in FIGS. 1F and 1G.

As in the first embodiment, in the gate electrode 131 having a silicide layer 114 formed as such, the bottom surface of the silicide layer 114 has an upward-convex circular arc shape. The top surface of the silicide layer 114 also has an upward-convex circular arc shape. A bottom surface of the silicide layer 114 has an approximately circular arc shape downward from a side end of the silicide layer 114 toward the center direction and a top surface of the silicide layer 114 has an approximately circular arc shape upward from a side end of the silicide layer 114 toward the center direction. Since both top and bottom surfaces of the silicide layer 114 have an upward-convex circular arc shape, the silicide layer 114 has an approximately uniform thickness in the cross section of FIG. 1G. Moreover, the gate electrode 131 having the silicide layer 114 has rounded ends at its top surface, and the shape of the rounded ends corresponds to the shape of the rounded ends 108 of the polysilicon film 103. Therefore, the rounded ends of the top surface of the gate electrode 131 have a radius of curvature (round radius) of 20 nm to 50 nm. The distance between the top end of the sidewall 110 and the top surface of the gate electrode 131 is 50 nm or less.

As in the first embodiment, problems which are caused by intensive application of film stresses can be prevented in the silicidation. In other words, cracking of the refractory metal 113 including a cap film, and insufficient diffusion of the refractory metal 113 into the polysilicon film 103 and insufficient diffusion of the polysilicon film 103 into the refractory metal 113 (insufficient silicidation) can be prevented. Therefore, the silicide layer 114 has a sufficient thickness even at the ends of the gate electrode 131 (i.e., even at the boundary with the sidewall 110) regardless of the gate width. It is assumed that a gate electrode (first gate electrode) 131 having a width of less than 150 nm as shown in FIG. 1G and a gate electrode (second gate electrode) 132 having a width of more than 500 nm as shown in FIG. 1G' are formed on a single substrate 101. In this case, of the thickness T(edge) of the silicide layer 114 of the first gate electrode 131 which is located in the boundary region with the sidewall 110, the thickness of the silicide layer 114 located below the top end of the sidewall 110 is 40% or more of the thickness T(center) of the silicide layer 114 in the middle of the second gate electrode 132 in the width direction. Since the silicide layer 114 has a sufficient thickness even at the ends of the gate electrode 131 (i.e., even at the boundary region with the sidewall 110) regardless of the gate width, variation in resistance within an individual gate electrode 131 and variation in resistance between a plurality of gate electrodes 131 are reduced.

In the above description, the etchback process of the BPSG film 123 shown in FIG. 8B is conducted under such conditions that the TEOS film 104 is etched. However, the TEOS film 104 may alternatively be removed by etching before the BPSG film 123 is deposited.

When etching is used to remove the BPSG film 123 in FIG. 8C, vapor phase hydrofluoric acid is preferably used. This is because vapor phase hydrofluoric acid can remove the BPSG film 123 while hardly etching the substrate 101, the gate insulating film 102, an element isolation oxide film, and the like.

Japanese Laid-Open Patent Publication No. 9-74199 discloses a technology in which the height of the sidewall is reduced in order to cause silicide reaction also from the side of the gate electrode. In this way, the cross-sectional area of the silicide layer in the width direction of the gate electrode is increased. This technology is different from the present application in two points. First, in order to reduce the height of the sidewall, anisotropic etching is conducted more than normal conditions. Therefore, the substrate in source/drain regions may be etched and damaged. Second, since the ends of the top surface of the polysilicon film to be formed into a gate electrode remain sharp, the silicide layer is likely to have an uneven thickness in a cross section of the gate electrode. Moreover, film stresses between the top surface of the gate electrode and the refractory metal layer and the sidewall are intensively applied to the sharp ends. As a result, the cap layer and the refractory metal layer are likely to crack, and thermal diffusion of refractory metal into silicon and thermal diffusion of silicon into refractory metal are likely to be prevented.

Japanese Laid-Open Patent Publication No. 7-66421 describes a semiconductor device which is used for memories and the like. In this semiconductor device, the ends of the gate electrode have an angle of at least 90° in order to prevent an electric field from being intensively applied to the ends of the gate electrode. However, no silicide layer is formed in this semiconductor device. Since the present application is directed to formation of a silicide layer having a uniform thickness, the object and the technical field of this technology are different from those of the present application, and the technical idea of this technology is completely different from that of the present application.

In the first to eighth embodiments described above, the ends 115 of the top surface of the polysilicon film 103 can be rounded more by combining a plurality of embodiments.

As has been described above, in the present invention, the ends of the top surface of the gate electrode are rounded so that the gate electrode does not have sharp portions at its top surface. Thereafter, a refractory metal is deposited and heat treatment is conducted for silicidation. Accordingly, film stresses between the refractory metal and the gate electrode are less likely to be intensively applied to the ends of the top surface of the gate electrode. Such reduced intensive application of the film stresses prevents cracking of the refractory metal and does not inhibit thermal diffusion of the refractory metal into the gate electrode in heat treatment. Therefore, the resultant silicide layer has a uniform, sufficient thickness even at the ends of the top surface of the gate electrode. As a result, resistance of the gate electrode is reduced and stabilized even when the gate width is small. The present invention thus enables implementation of a semiconductor device which does not cause instable operation due to delay and variation of electric signals of the gate electrode.

What is claimed is:

1. A semiconductor device, comprising:
   a substrate; and
   a first gate electrode formed on the substrate and extending in a prescribed direction, wherein
   the first gate electrode has a first silicide layer at its top surface, and
   a bottom surface of the first silicide layer has an approximately circular arc shape downward from a side end of the first silicide layer toward the center direction and a top surface of the first silicide layer has an approximately circular arc shape upward from a side end of the first silicide layer toward the center direction.

2. The semiconductor device according to claim 1, wherein a first sidewall is formed on a side surface of the first gate electrode, and a distance between the top surface of the first gate electrode and a top end of the first sidewall is 0 nm to 50 nm.

3. The semiconductor device according to claim 1, comprising the first gate electrode and a second gate electrode respectively formed on the substrate and extending in the prescribed direction,
   wherein the first gate electrode has the first silicide layer on the top surface thereof and the second gate electrode has a second silicide layer on the top surface thereof, and
   the first gate electrode has an electrode width of less than 150 nm and the second gate electrode has an electrode width of more than 500 nm.

4. The semiconductor device according to claim 1, wherein the first silicide layer is formed from two layers.

5. The semiconductor device according to claim 1, wherein center portions of the top and bottom surface of the first silicide layer have an upward approximately circular arc shape.

6. A semiconductor device, comprising:
   a substrate; and
   a first gate electrode formed on the substrate and extending in a prescribed direction, wherein
   the first gate electrode has a first polysilicon layer and a first silicide layer formed on the first polysilicon layer, and
   a top surface of the first polysilicon layer has a circular shape downward from a side end of the first polysilicon layer toward the center direction.

7. The semiconductor device according to claim 6, wherein the center portion of the top surface of the first polysilicon layer has an upward approximately circular arc shape.

8. The semiconductor device according to claim 6, wherein
   a bottom surface of the first silicide layer has an approximately circular arc shape downward from a side end of the first silicide layer toward the center direction, and
   a top surface of the first silicide layer has an approximately circular arc shape upward from a side end of the first silicide layer toward the center direction.

9. The semiconductor device according to claim 6, wherein center portions of the top and bottom surface of the first silicide layer have an upward approximately circular arc shape.

10. The semiconductor device according to claim 6, wherein
    a first sidewall is formed on a side surface of the first gate electrode, and a distance between the top surface of the first gate electrode and a top end of the first sidewall is 0 nm to 50 nm.

11. The semiconductor device according to claim 6, wherein the first silicide layer is formed from two layers.

12. The semiconductor device according to claim 3, wherein
    a first sidewall is formed on a side surface of the first gate electrode, and
    in the first silicide layer of the first gate electrode which is present in a boundary region with the first sidewall, a thickness of the first silicide layer located below the top end of the first sidewall is 40% or more of a thickness of the second silicide layer in a middle of the second gate electrode in a width direction.

13. The semiconductor device according to claim 3, wherein
    a bottom surface of the second silicide layer has an approximately circular arc shape downward from a side end of the second silicide layer toward the center direction, and
    a top surface of the second silicide layer has an approximately circular arc shape upward from a side end of the second silicide layer toward the center direction.

14. The semiconductor device according to claim 3, wherein center portions of the top and bottom surface of the first silicide layer have an upward approximately circular arc shape.

15. The semiconductor device according to claim 3, wherein
    the second gate electrode has a second polysilicon layer and a second silicide layer formed on the second polysilicon layer, and
    a top surface of the second polysilicon layer has an approximately circular arc shape downward from a side end of the second polysilicon layer toward the center direction.

16. The semiconductor device according to claim 3, wherein a second sidewall is formed on a side surface of the second gate electrode, and a distance between the top surface of the second gate electrode and a top end of the second sidewall is 0 nm to 50 nm.

17. The semiconductor device according to claim 1, wherein the first silicide layer has an approximately same thickness at the side end and in the middle.

18. The semiconductor device according to claim 6, wherein the first polysilicon layer has a rounded end.

* * * * *

UNITED STATES PATENT AND TRADEMARK OFFICE
CERTIFICATE OF CORRECTION

| | | |
|---|---|---|
| PATENT NO. | : 7,663,191 B2 | Page 1 of 1 |
| APPLICATION NO. | : 11/178612 | |
| DATED | : February 16, 2010 | |
| INVENTOR(S) | : Kanegae et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 505 days.

Signed and Sealed this

Thirtieth Day of November, 2010

David J. Kappos
*Director of the United States Patent and Trademark Office*